United States Patent
Chen et al.

(10) Patent No.: US 9,735,129 B2
(45) Date of Patent: Aug. 15, 2017

(54) SEMICONDUCTOR PACKAGES AND METHODS OF FORMING THE SAME

(71) Applicant: Taiwan Semiconductor Manufacturing Company, Ltd., Hsin-Chu (TW)

(72) Inventors: Hsien-Wei Chen, Hsin-Chu (TW); Jie Chen, New Taipei (TW); Der-Chyang Yeh, Hsin-Chu (TW); Shin-Puu Jeng, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/447,426

(22) Filed: Jul. 30, 2014

(65) Prior Publication Data

US 2015/0270247 A1    Sep. 24, 2015

Related U.S. Application Data

(63) Continuation-in-part of application No. 14/222,475, filed on Mar. 21, 2014, now Pat. No. 9,318,452.

(51) Int. Cl.
*H01L 29/00* (2006.01)
*H01L 25/065* (2006.01)
(Continued)

(52) U.S. Cl.
CPC ...... *H01L 25/0655* (2013.01); *H01L 21/4857* (2013.01); *H01L 23/544* (2013.01);
(Continued)

(58) Field of Classification Search
CPC . H01L 2924/01049; H01L 2924/01047; H01L 2924/01029; H01L 2924/2064;
(Continued)

(56) References Cited

U.S. PATENT DOCUMENTS 8,193,647 B2   6/2012  Hsieh et al.
8,669,140 B1   3/2014  Muniandy et al.
(Continued)

FOREIGN PATENT DOCUMENTS

| CN | 102280423 A | 12/2011 |
|---|---|---|
| TW | 201104823 A | 2/2011 |
| TW | 201201344 A | 1/2012 |

*Primary Examiner* — Trung Q Dang
*Assistant Examiner* — Wasiul Haider
(74) *Attorney, Agent, or Firm* — Slater Matsil, LLP

(57) ABSTRACT

Embodiments of the present disclosure include semiconductor packages and methods of forming the same. An embodiment is a semiconductor package including a first package including one or more dies, and a redistribution layer coupled to the one or more dies at a first side of the first package with a first set of bonding joints. The redistribution layer including more than one metal layer disposed in more than one passivation layer, the first set of bonding joints being directly coupled to at least one of the one or more metal layers, and a first set of connectors coupled to a second side of the redistribution layer, the second side being opposite the first side.

20 Claims, 23 Drawing Sheets

(51) Int. Cl.
*H01L 25/00* (2006.01)
*H01L 21/48* (2006.01)
*H01L 25/10* (2006.01)
*H01L 23/544* (2006.01)
*H01L 23/00* (2006.01)
*H01L 23/31* (2006.01)
*H01L 21/56* (2006.01)
*H01L 23/498* (2006.01)
*H01L 23/538* (2006.01)

(52) U.S. Cl.
CPC .............. *H01L 24/03* (2013.01); *H01L 24/13* (2013.01); *H01L 24/19* (2013.01); *H01L 24/20* (2013.01); *H01L 24/81* (2013.01); *H01L 24/96* (2013.01); *H01L 25/105* (2013.01); *H01L 25/50* (2013.01); *H01L 21/561* (2013.01); H01L 21/568 (2013.01); H01L 23/3114 (2013.01); H01L 23/3128 (2013.01); H01L 23/49811 (2013.01); H01L 23/49816 (2013.01); H01L 23/5383 (2013.01); H01L 23/5389 (2013.01); H01L 24/06 (2013.01); H01L 24/11 (2013.01); H01L 24/16 (2013.01); H01L 24/17 (2013.01); H01L 2223/5442 (2013.01); H01L 2223/54426 (2013.01); H01L 2223/54486 (2013.01); H01L 2224/02319 (2013.01); H01L 2224/0345 (2013.01); H01L 2224/03438 (2013.01); H01L 2224/0401 (2013.01); H01L 2224/04105 (2013.01); H01L 2224/05166 (2013.01); H01L 2224/05568 (2013.01); H01L 2224/05624 (2013.01); H01L 2224/05639 (2013.01); H01L 2224/05644 (2013.01); H01L 2224/05647 (2013.01); H01L 2224/05684 (2013.01); H01L 2224/06181 (2013.01); H01L 2224/1145 (2013.01); H01L 2224/11332 (2013.01); H01L 2224/11452 (2013.01); H01L 2224/11462 (2013.01); H01L 2224/12105 (2013.01); H01L 2224/131 (2013.01); H01L 2224/13005 (2013.01); H01L 2224/13006 (2013.01); H01L 2224/13022 (2013.01); H01L 2224/13023 (2013.01); H01L 2224/13083 (2013.01); H01L 2224/13084 (2013.01); H01L 2224/13109 (2013.01); H01L 2224/13111 (2013.01); H01L 2224/13139 (2013.01); H01L 2224/13144 (2013.01); H01L 2224/13147 (2013.01); H01L 2224/13155 (2013.01); H01L 2224/13164 (2013.01); H01L 2224/13166 (2013.01); H01L 2224/13181 (2013.01); H01L 2224/16237 (2013.01); H01L 2224/17181 (2013.01); H01L 2224/81191 (2013.01); H01L 2224/81193 (2013.01); H01L 2224/81815 (2013.01); H01L 2224/96 (2013.01); H01L 2225/0651 (2013.01); H01L 2225/06568 (2013.01); H01L 2225/1023 (2013.01); H01L 2225/1035 (2013.01); H01L 2225/1041 (2013.01); H01L 2225/1058 (2013.01); H01L 2924/12042 (2013.01); H01L 2924/181 (2013.01)

(58) Field of Classification Search
CPC ..... H01L 2924/0132; H01L 2224/8112; H01L 2224/02331; H01L 25/0655
See application file for complete search history.

(56) References Cited

U.S. PATENT DOCUMENTS

| | | | |
|---|---|---|---|
| 8,896,136 B2 | 11/2014 | Tsai et al. | |
| 8,912,044 B2* | 12/2014 | Hu | 438/106 |
| 8,922,004 B2 | 12/2014 | Lin et al. | |
| 8,937,381 B1* | 1/2015 | Dunlap | H01L 23/3128 |
| | | | 257/686 |
| 9,224,697 B1* | 12/2015 | Kwon | H01L 24/95 |
| 2008/0050901 A1 | 2/2008 | Kweon et al. | |
| 2010/0006963 A1* | 1/2010 | Brady | H01L 27/14618 |
| | | | 257/432 |
| 2010/0013081 A1* | 1/2010 | Toh | H01L 23/49816 |
| | | | 257/692 |
| 2010/0155932 A1 | 6/2010 | Gambino et al. | |
| 2010/0171206 A1* | 7/2010 | Chu | H01L 21/565 |
| | | | 257/686 |
| 2011/0001250 A1 | 1/2011 | Lin et al. | |
| 2011/0101527 A1 | 5/2011 | Cheng et al. | |
| 2012/0273959 A1 | 11/2012 | Park et al. | |
| 2013/0009325 A1* | 1/2013 | Mori | H01L 23/5389 |
| | | | 257/774 |
| 2013/0105991 A1 | 5/2013 | Gan et al. | |
| 2013/0119539 A1 | 5/2013 | Hsiao et al. | |
| 2013/0234318 A1 | 9/2013 | Lee et al. | |
| 2013/0341784 A1 | 12/2013 | Lin et al. | |
| 2014/0057394 A1 | 2/2014 | Ramasamy et al. | |
| 2014/0077366 A1* | 3/2014 | Kim | H01L 24/19 |
| | | | 257/737 |
| 2014/0264914 A1 | 9/2014 | Meyer et al. | |
| 2015/0179570 A1* | 6/2015 | Marimuthu | H01L 23/5389 |
| | | | 257/774 |
| 2015/0179616 A1 | 6/2015 | Lin et al. | |
| 2015/0235991 A1* | 8/2015 | Gu | H01L 25/0655 |
| | | | 257/762 |

\* cited by examiner

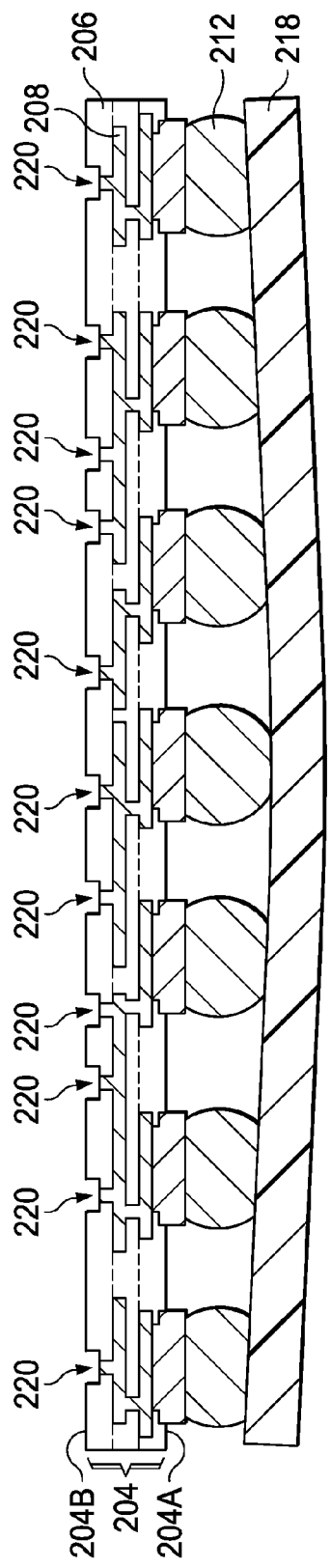
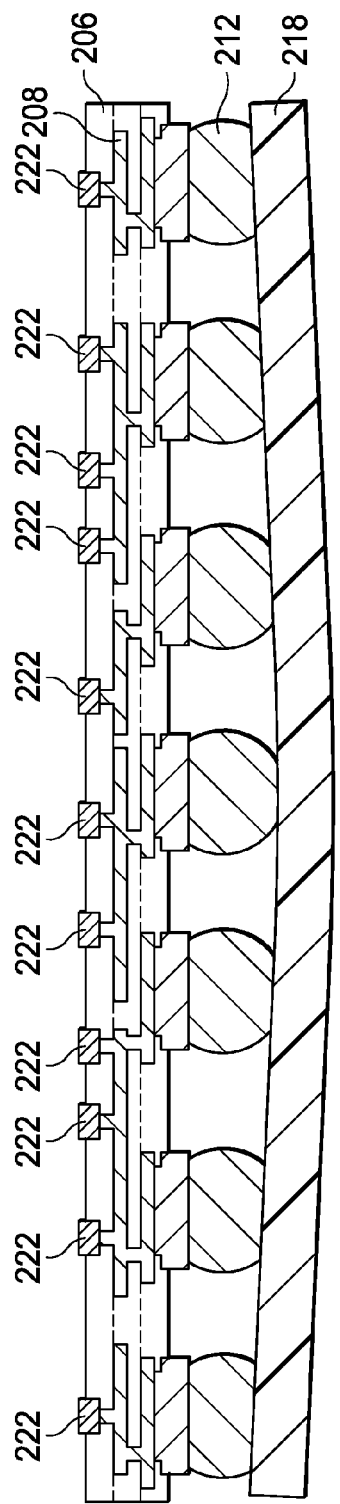
FIG. 2D
FIG. 2E

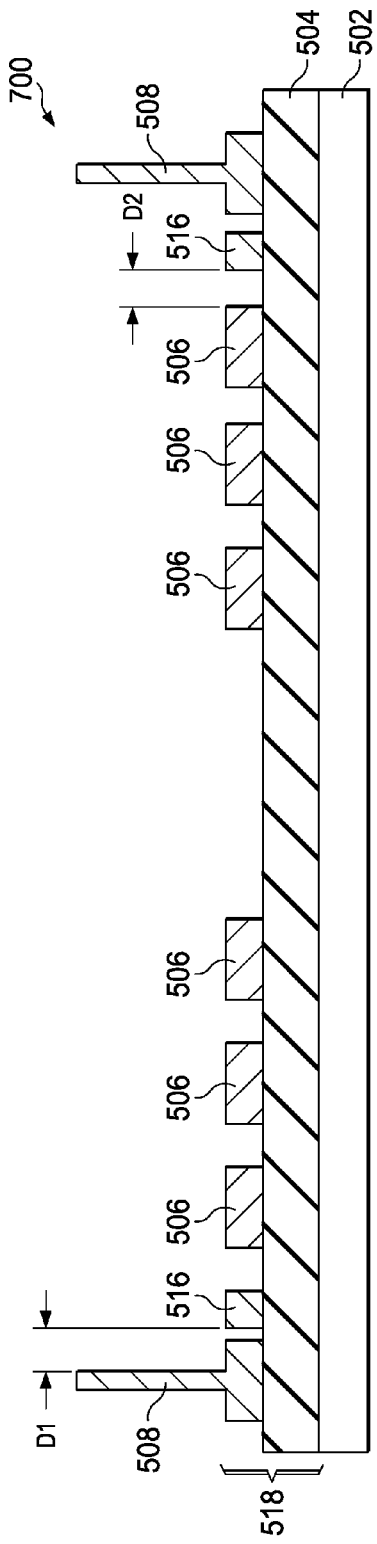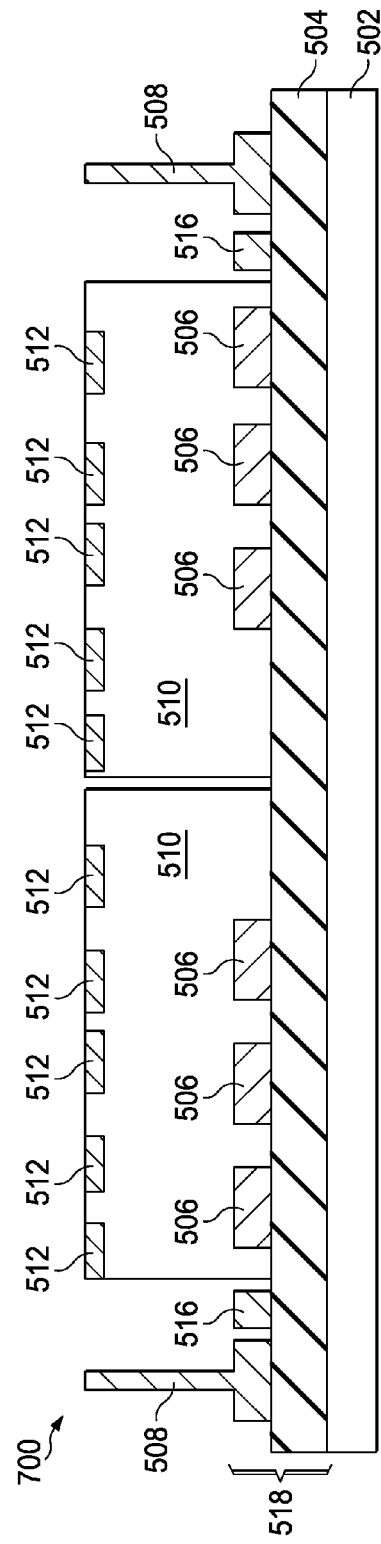

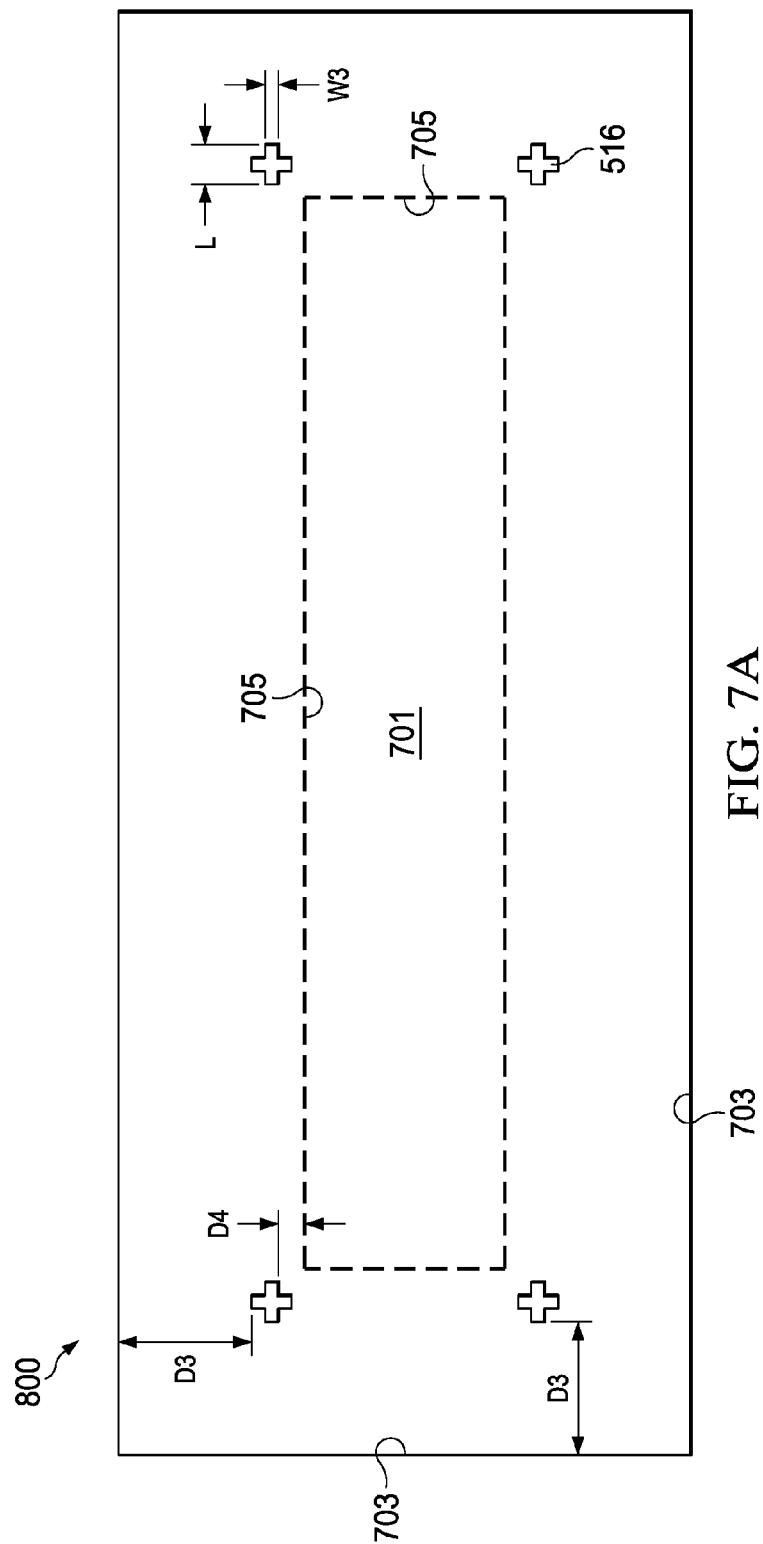

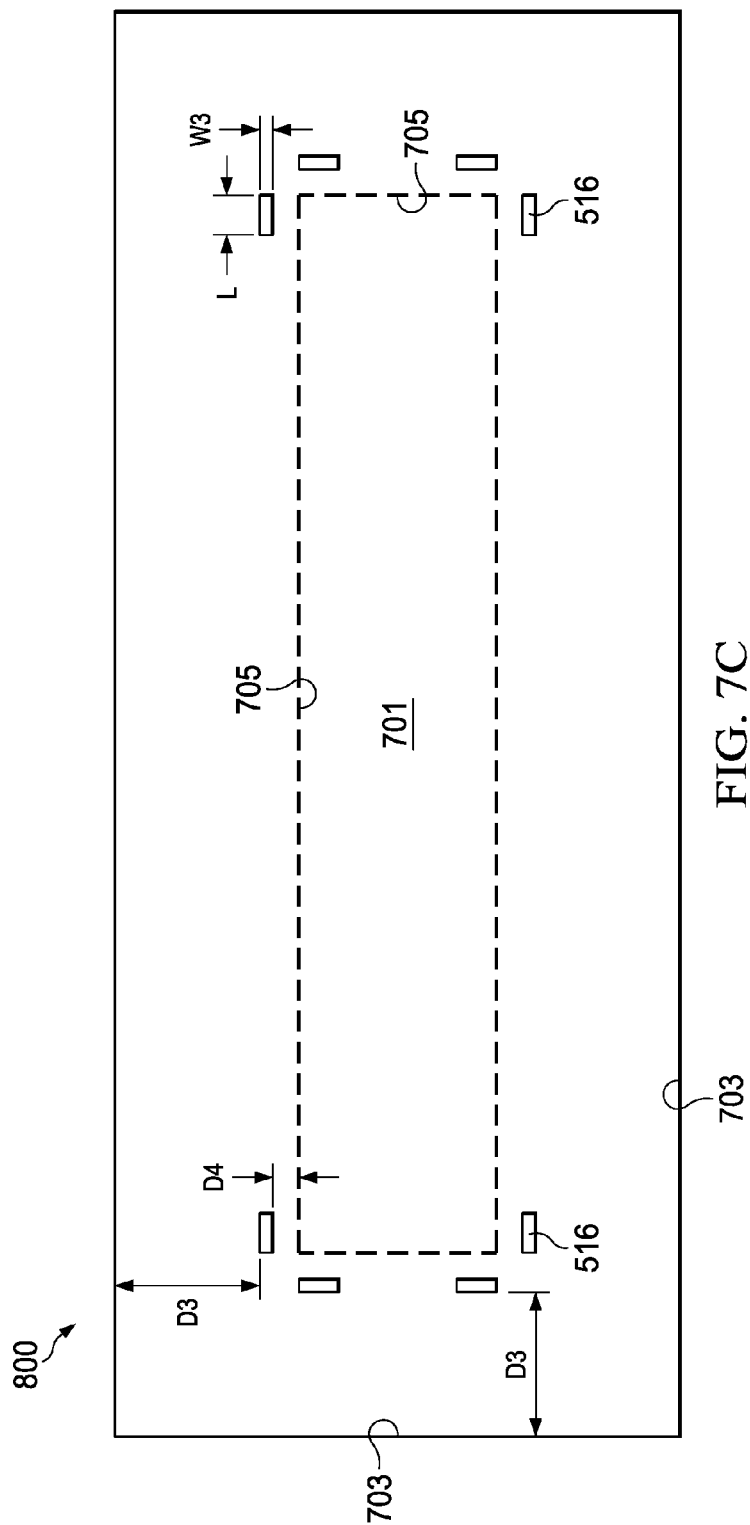

SEMICONDUCTOR PACKAGES AND METHODS OF FORMING THE SAME

PRIORITY CLAIM AND CROSS-REFERENCE

This application is a continuation-in-part of, and claims the benefit of, U.S. patent application Ser. No. 14/222,475, filed on Mar. 21, 2014, titled "Semiconductor Packages and Methods of Forming the Same," which is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 2E illustrate cross-sectional views of intermediate steps in forming a redistribution layer in accordance with some embodiments.

FIGS. 5A through 5C illustrate cross-sectional views of intermediate steps in forming a die package in accordance with some embodiments.

FIGS. 7A-7E are planar views illustrating alignment structures in accordance with some embodiments.

DETAILED DESCRIPTION

Figure 1A:
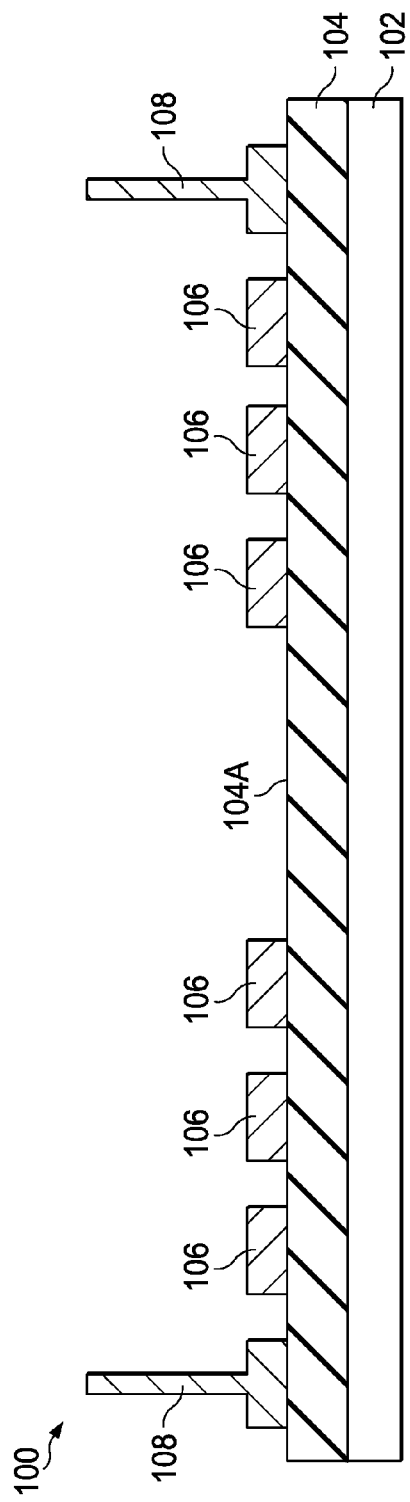
FIGS. 1A through 1D illustrate cross-sectional views of intermediate steps in forming a die package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely a three dimensional (3D) integrated fan-out (InFO) package-on-package (PoP) device. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

FIGS. 1A through 1D illustrate cross-sectional views of intermediate steps in forming a die package 100 in accordance with some embodiments. The die package 100 in FIG. 1A includes dielectric layer 104 over a carrier substrate 102, and bond pads 106 and electrical connectors 108 over the dielectric layer 104. The carrier substrate 102 may be any suitable substrate that provides (during intermediary operations of the fabrication process) mechanical support for the layers over the carrier substrate 102. The carrier substrate 102 may be a wafer including glass, silicon (e.g., a silicon wafer), silicon oxide, metal plate, a ceramic material, or the like.

The dielectric layer 104 is formed over the carrier substrate 102. The passivation layer can be silicon nitride, silicon carbide, silicon oxide, low-k dielectrics such as carbon doped oxides, extremely low-k dielectrics such as porous carbon doped silicon dioxide, a polymer, such as an epoxy, polyimide, benzocyclobutene (BCB), polybenzoxazole (PBO), the like, or a combination thereof, although other relatively soft, often organic, dielectric materials can also be used. The dielectric layer 104 may be deposited by chemical vapor deposition (CVD), physical vapor deposition (PVD), atomic layer deposition (ALD), a spin-on-dielectric process, the like, or a combination thereof.

The bond pads 106 are formed over the dielectric layer 104. In some embodiments, the bond pads 106 are formed by forming recesses (not shown) into the dielectric layer 104. The recesses may be formed to allow the bond pads 106 to be embedded into the dielectric layer 104. In other embodiments, the recesses are omitted as the bond pads 106 may be formed on a first side 104A of the dielectric layer 104. The bond pads 106 electrically and/or physically couple the subsequently bonded dies 110 to the subsequently bonded package 400 (see FIG. 3D), and/or the electrical connectors 108. In some embodiments, the bond pads 106 include a thin seed layer (not shown) made of copper, titanium, nickel, gold, the like, or a combination thereof. The conductive material of the bond pads 106 may be deposited over the thin seed layer. The conductive material may be formed by an electro-chemical plating process, CVD, ALD, PVD, the like, or a combination thereof. In an embodiment, the conductive material of the bond pads 106 is copper, tungsten, aluminum, silver, gold, the like, or a combination thereof.

In an embodiment, the bond pads 106 are underbump metallizations (UBMs) that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 106. Any suitable materials or layers of material that may be used for the UBMs 106 are fully intended to be included within the scope of the current application.

The electrical connectors 108 are formed over the dielectric layer 104 and extend from the dielectric layer 104 in a direction that is substantially perpendicular to the first side 104A of the dielectric layer 104. The electrical connectors 108 may be stud bumps, which are formed by wire bonding on the bond pads, and cutting the bond wire with a portion of bond wire left attached to the respective bond ball. For example, in FIG. 1A, the electrical connectors 108 include a lower portion and an upper portion, wherein the lower portion may be a bond ball formed in the wire bonding, and the upper portion may be the remaining bond wire. The upper portion of the electrical connector 108 may have a uniform width and a uniform shape that are uniform throughout the top part, the middle part, and the bottom part of upper portion. The electrical connectors 108 are formed of non-solder metallic materials that can be bonded by a wire bonder. In some embodiments, the electrical connectors 108 are made of copper wire, gold wire, the like, or a combination thereof, and may have a composite structure including a plurality of layers.

In alternative embodiments, the electrical connectors 108 are formed through electrical plating. In these embodiments, the electrical connectors 108 are made of copper, aluminum, nickel, gold, silver, palladium, the like, or a combination thereof, and may have a composite structure including a plurality of layers. In these embodiments, a sacrificial layer (not shown) is formed over the carrier substrate. A plurality of openings is formed in the sacrificial layer to expose the underlying bond pads. A plating step is then performed to plate the electrical connectors 108. After the formation of the electrical connectors 108, the sacrificial layer is then removed.

The electrical connectors 108 and the bond pads 106 may be collectively referred to as a backside redistribution layer for the die package 100. This backside redistribution layer may be used to couple another package(s) or component(s) (see package 400 in FIG. 3D) to the die package 100.

Figure 1B:
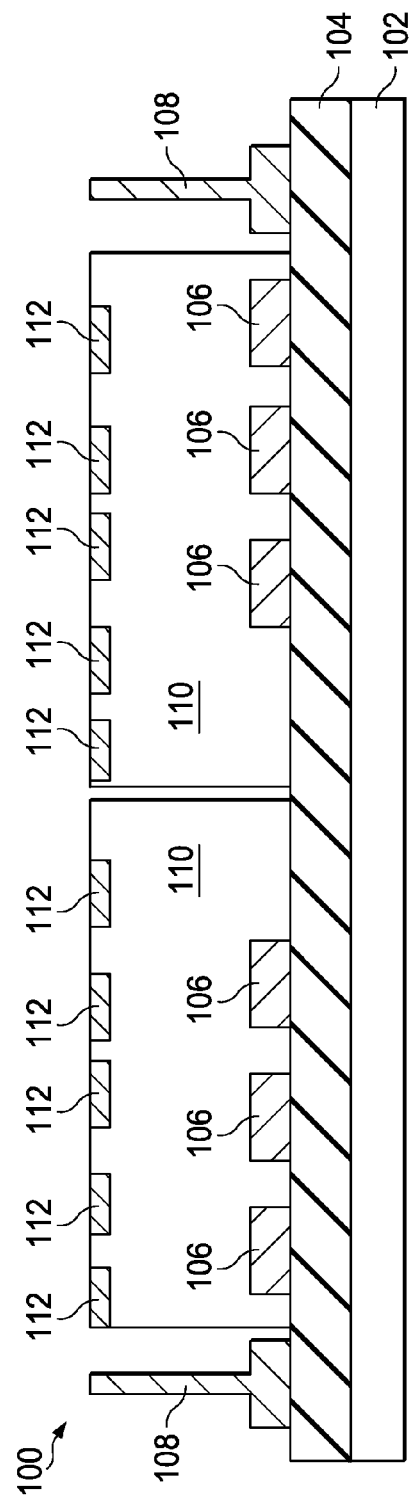

FIG. 1B illustrates bonding one or more dies 110 to the bond pads 106. A first side of the die(s) 110 may be coupled to the bond pads 106. The die(s) 110 may be a single die or may be more than two dies. The dies(s) 110 may include a logic die, such as a central processing unit (CPU), a graphics processing unit (GPU), the like, or a combination thereof. In some embodiments, the die(s) 110 includes a die stack (not shown) which may include both logic dies and memory dies. The die(s) 110 may include an input/output (I/O) die, such as a wide I/O die that provides a connection between the die package 100 and the subsequently attached package 400 (see FIG. 3D).

The die(s) 110 include contact areas 112 on a second side of the die(s) 110. In some embodiments, the contact areas 112 are similar to the bond pads 106 described above and the description is not repeated herein. In other embodiments, the contact areas 112 are vias extending from the second side of the die(s) partially into the die(s) 110 or, in some embodiments, completely through the die(s) 110. The vias 112 may be formed by an etch process to form holes (not shown) in the die(s) 110 and the holes may be filled by a conductive material such as copper, aluminum, nickel, gold, silver, palladium, the like, or a combination thereof, and may have a composite structure including a plurality of layers. The vias 112 may also include seed layers, barrier layers, liners, the like, or a combination thereof.

Figure 1C:
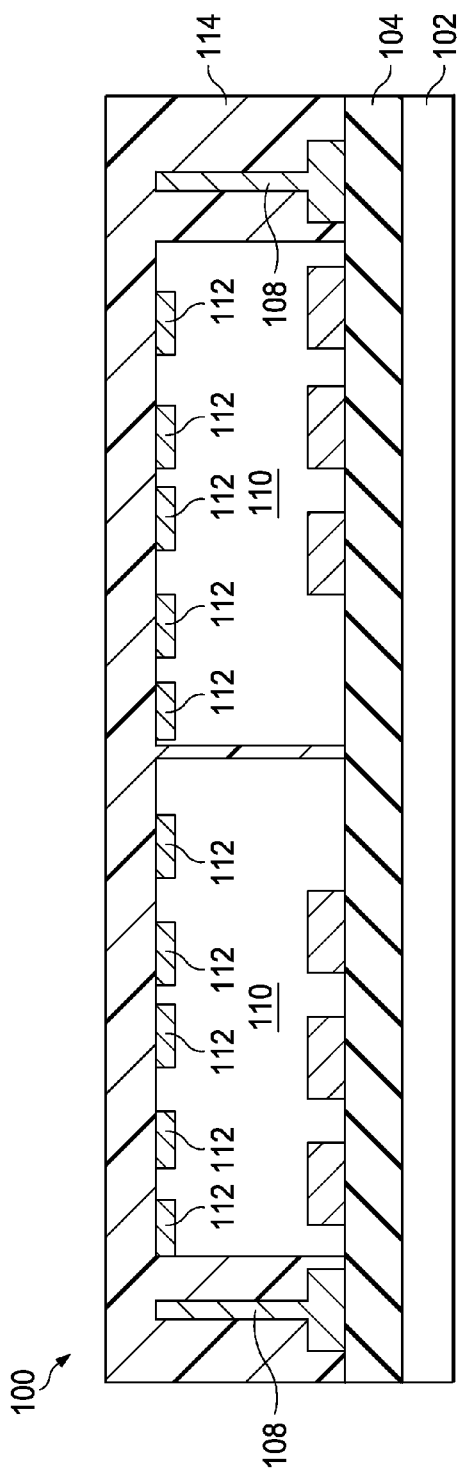

FIG. 1C illustrates the encapsulation of the die(s) 110 and the electrical connectors 108. In some embodiments, the die(s) 110 and the electrical connectors 108 are encapsulated by a molding material 114. The molding material 114 may be molded on the die(s) 110 and the electrical connectors 108, for example, using compression molding. In some embodiments, the molding material 114 is made of a molding compound, a polymer, an epoxy, silicon oxide filler material, the like, or a combination thereof. A curing step may be performed to cure the molding material 114, wherein the curing may be a thermal curing, a Ultra-Violet (UV) curing, the like, or a combination thereof.

Figure 1D:
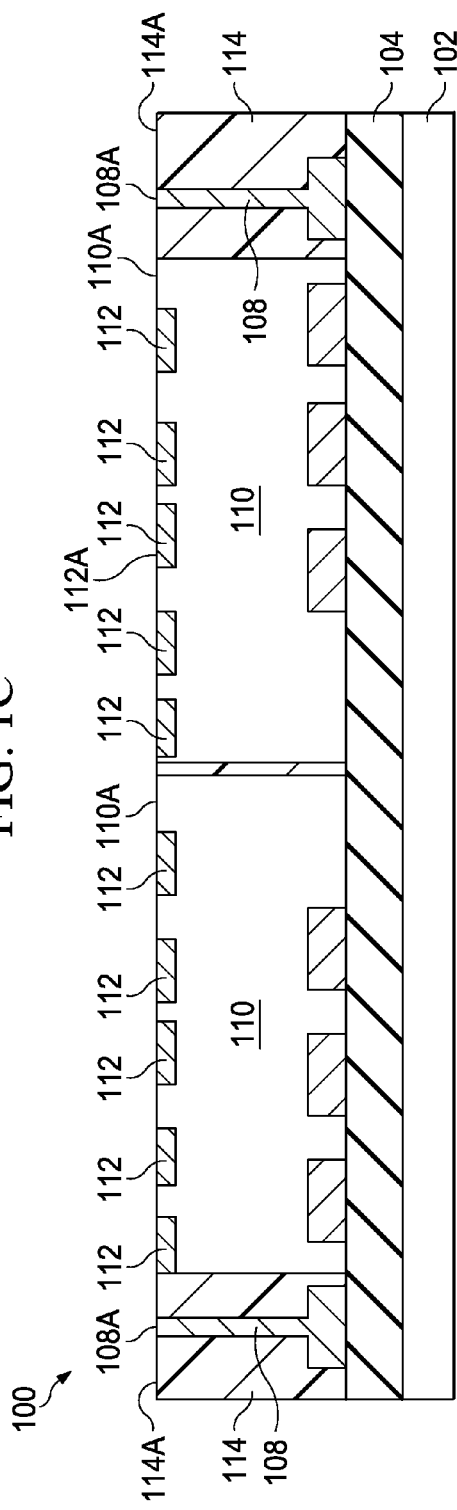

In some embodiments, the die(s) 110, the contact areas 112, and the electrical connectors 108 are buried in the molding material 114, and after the curing of the molding material 114, a planarization step, such as a grinding, is performed on the molding material 114 as illustrated in FIG. 1D. The planarization step is used to remove excess portions of the molding material 114, which excess portions are over top surfaces of the contact areas 112 and the electrical connectors 108. In some embodiments, surfaces 112A of the contact areas 112 and surfaces 108A of the electrical connectors 108 are exposed, and are level with a surface 114A of the molding material 114. The electrical connectors 108 may be referred to as through molding vias (TMVs), through package vias (TPVs), and/or through InFO vias (TIVs) and will be referred to as TIVs 108 hereinafter.

Figure 2A:
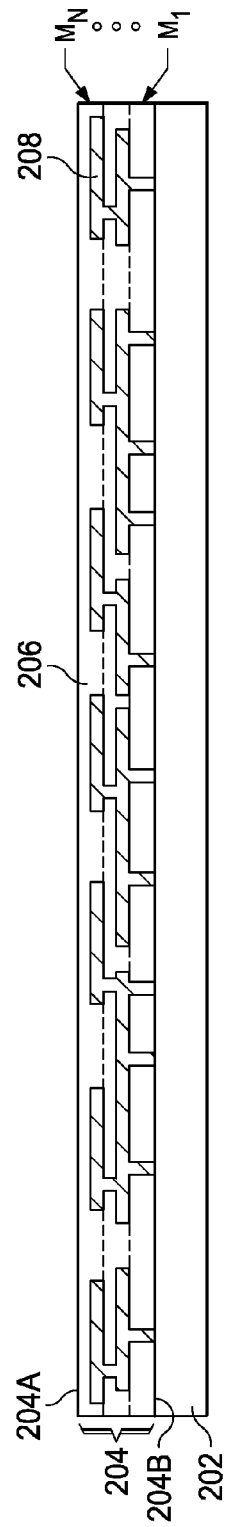

FIGS. 2A through 2E illustrate cross-sectional views of intermediate steps in forming a redistribution layer 204 in accordance with some embodiments. FIG. 2A illustrates a redistribution layer 204 over a carrier substrate 202. The redistribution layer 204 is formed with a first side 204A distal the carrier substrate 202 and a second side 204B proximate the carrier substrate 202.

Figure 2B:
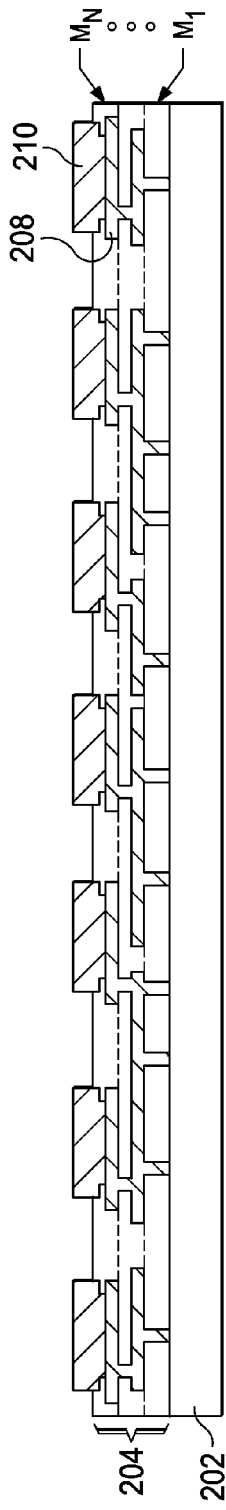

The redistribution layer 204 includes more than one metal layer, namely $M_1$ and $M_N$, wherein the metal layer $M_1$ is the metal layer immediately adjacent the carrier substrate 202, and metal layer $M_N$ (sometimes referred to as the top metal layer $M_N$) is the metal layer immediately adjacent UBMs 210 (see FIG. 2B). Throughout the description, the term "metal layer" refers to the collection of the metal lines 208 in the same layer. The redistribution layer 204 further includes more than one passivation layer 206, wherein the more than one metal layers ($M_1$ through $M_N$) are disposed in the more than one passivation layers 206.

The passivation layers 206 can be silicon nitride, silicon carbide, silicon oxide, low-k dielectrics such as carbon doped oxides, extremely low-k dielectrics such as porous carbon doped silicon dioxide, a polymer, such as an epoxy, polyimide, BCB, PBO, the like, or a combination thereof, although other relatively soft, often organic, dielectric materials can also be used, and deposited by CVD, PVD, ALD, a spin-on-dielectric process, the like, or a combination thereof. In an embodiment, each passivation layer 206 is formed to a thickness from about 5 μm to about 15 μm. The passivation layers 206 may undergo a curing step to cure the passivation layers 206, wherein the curing may be a thermal curing, an UV curing, the like, or a combination thereof.

The metal layers, $M_1$ and $M_N$, may be formed using a single and/or a dual damascene process, a via-first process, or a metal-first process. The metal layers ($M_1$ and $M_N$) and vias may be formed of a conductive material, such as copper, aluminum, titanium, the like, or a combination thereof, with or without a barrier layer. In an embodiment, each of the metal layers $M_1$ through $M_N$ has a thickness in a range from about 3 μm to about 15 μm.

A damascene process is the formation of a patterned layer embedded in another layer such that the top surfaces of the two layers are coplanar. A damascene process, which creates either only trenches or vias, is known as a single damascene process. A damascene process, which creates both trenches and vias at once, is known as a dual damascene process.

In an exemplary embodiment, the metal layers $M_1$ through $M_N$ are formed using a dual damascene process. In this example, the formation of the $M_1$ layer may begin with the formation of an etch stop layer (not shown) on the lowermost passivation layer 206 and with the next passivation layer 206 on the etch stop layer. Once the next passivation layer 206 is deposited, portions of the next passivation layer 206 may be etched away to form recessed features, such as trenches and vias, which can be filled with conductive material to connect different regions of the redistribution layer 204 and accommodate the metal lines 208 and vias. This process may be repeated for the remaining metal layers through $M_N$.

The redistribution layer 204 may be referred to as a frontside redistribution layer for the die package 100. This frontside redistribution layer 204 may be utilized to couple the die package 100 via the connectors 212 to one or more packages, package substrates, components, the like, or a combination thereof.

The number of metal layers $M_1$ to $M_N$ and the number of passivation layers 206 are only for illustrative purposes and are not limiting. There could be other number of layers that is more or less than the two metal layers illustrated. There may be other number of passivation layers, and other number of metal layers different from those illustrated in FIG. 2A.

FIG. 2B illustrates the forming of UBMs 210 over and electrically coupled to the top metal layer $M_N$. A set of openings (not shown) may be formed through the topmost passivation layer 206 to expose surfaces of the metal lines 208 in the metal layer $M_N$. The UBMs 210 may extend through these openings in the passivation layer 206 and also extend along a surface of passivation layer 206. The UBMs 210 may include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 210. Any suitable materials or layers of material that may be used for the UBMs 210 are fully intended to be included within the scope of the current application.

Figure 2C:
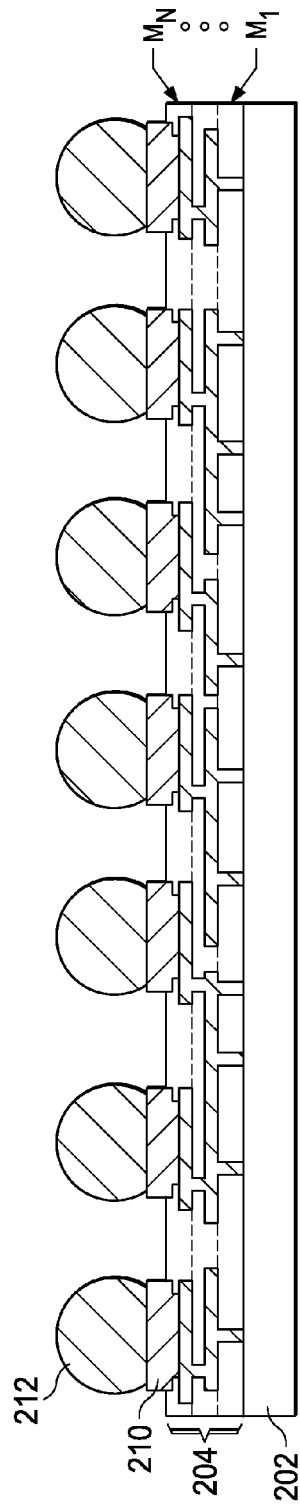

FIG. 2C illustrates the formation of a set of conductive connectors 212 over and electrically coupled to the UBMs 210. The conductive connectors 212 may be solder balls, metal pillars, controlled collapse chip connection (C4) bumps, micro bumps, electroless nickel-electroless palladium-immersion gold technique (ENEPIG) formed bumps, or the like. The conductive connectors 212 may include a conductive material such as solder, copper, aluminum, gold, nickel, silver, palladium, tin, the like, or a combination thereof. In an embodiment in which the conductive connectors 212 are solder bumps, the conductive connectors 212 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 212 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 212. The metal cap layer may include nickel, tin, tin-lead, gold, silver, palladium, indium, nickel-palladium-gold, nickel-gold, the like, or a combination thereof and may be formed by a plating process.

FIG. 2D illustrates flipping the redistribution layer 204 over and placing it on a dicing tape 218 and removing the carrier substrate 202. After the carrier substrate 202 is removed, the second side 204B of the redistribution layer 204 is exposed. As illustrated in FIG. 2D, a set of openings 220 are formed in at least one of the passivation layers 206 to expose portions of the metal lines 208. The openings 220 may be formed a laser drill process, an etch process, the like, or a combination thereof.

FIG. 2E illustrates the formation of a set of bonding structures 222 in the openings 220 and electrically coupled to the exposed metal lines 208 of the redistribution layer 204. The bonding structures 222 may include solder paste, micro bumps, solder balls, UBMs, flux, the like, or a combination thereof. The details of the bonding structures will be discussed below in FIGS. 4A through 4D.

FIGS. 3A through 3D illustrate cross-sectional views of intermediate steps in forming a semiconductor package 300 including the die package 100 from FIGS. 1A through 1D and the redistribution layer 204 from FIGS. 2A through 2E in accordance with some embodiments.

Figure 3A:
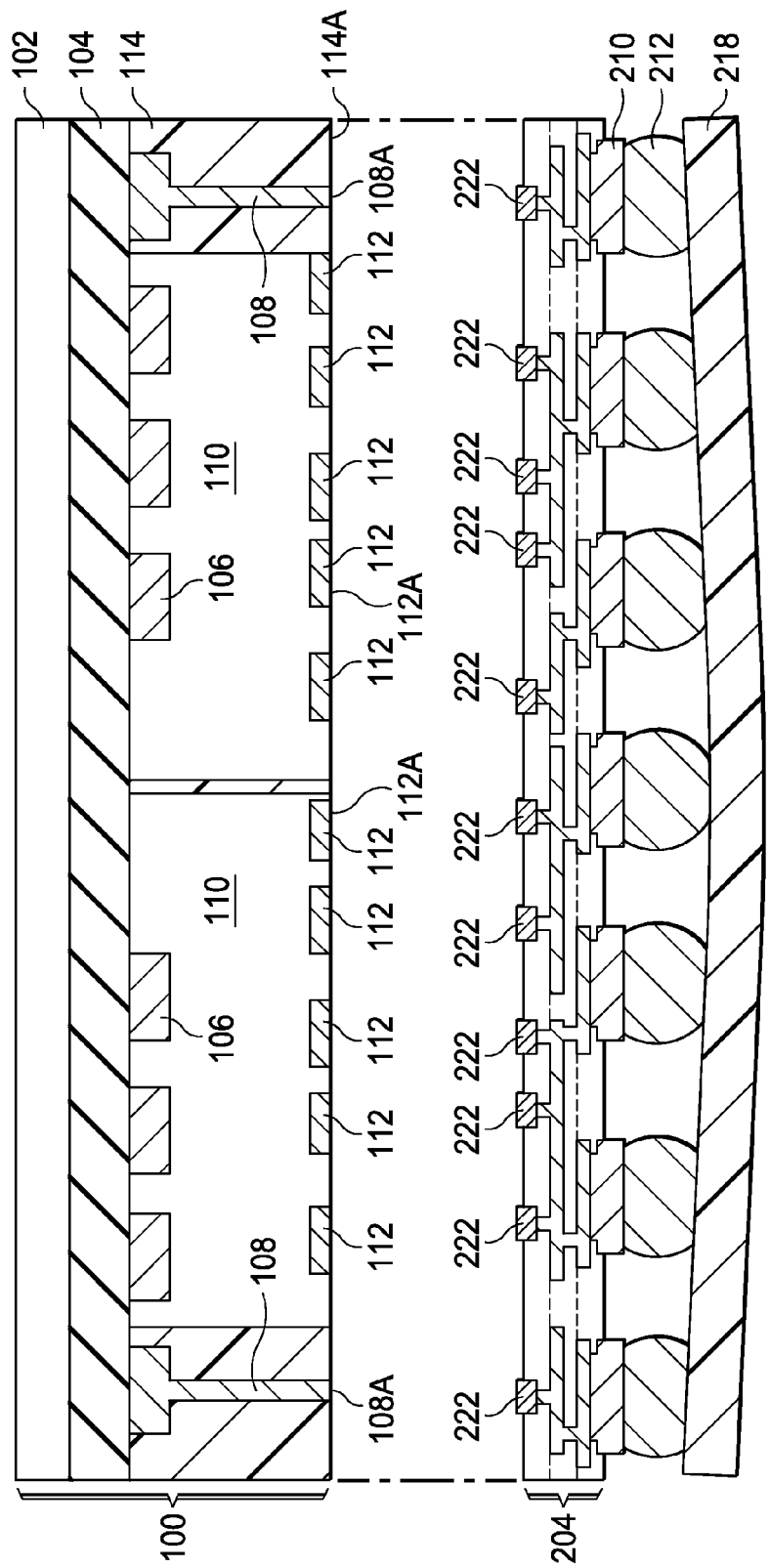
FIGS. 3A through 3D illustrate cross-sectional views of intermediate steps in forming a semiconductor package including the die package from FIGS. 1A through 1D and the redistribution layer from FIGS. 2A through 2E in accordance with some embodiments.
Figure 3B:
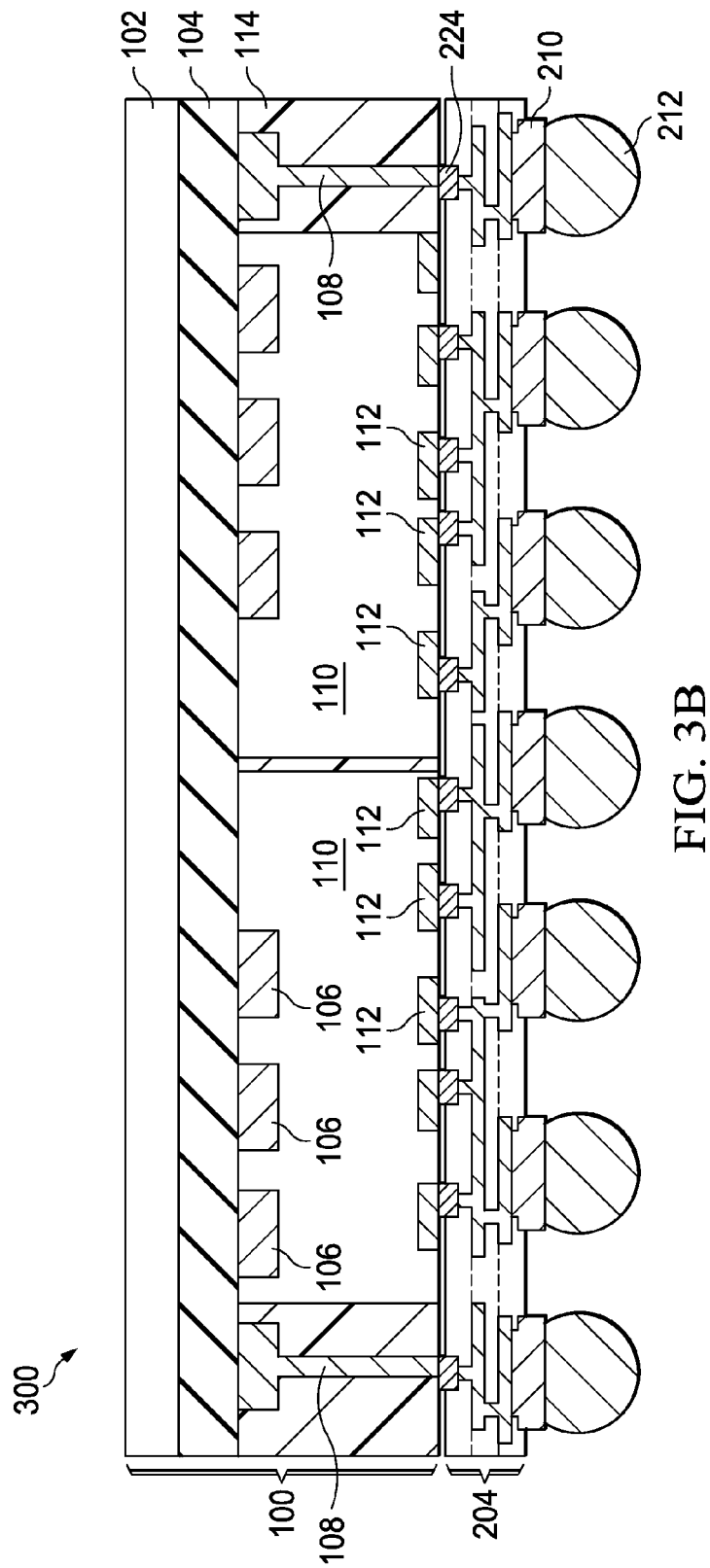

FIG. 3A illustrates the die package 100 being flipped over with the contact areas 112 and the TIVs 108 being over aligned with the bonding structures 222 of the redistribution layer 204. FIG. 3B illustrates bonding the die package 100 to the redistribution layer 204.

The bonding between the die package 100 and the redistribution layer 204 may be a solder bonding or a direct metal-to-metal (such as a copper-to-copper or tin-to-tin) bonding. In an embodiment, the die package 100 is bonded to the redistribution layer 204 by a reflow process. During this reflow process, the bonding structures 222 are in contact with the contact areas 112 and the TIVs 108 to physically and electrically couple the die package 100 to the redistribution layer 204 and to form bonding joints 224 from the bonding structures 222. In some embodiments, a bonding structure (not shown), which may be similar to the bonding structures 222, is formed on the contact areas 112 and the TIVs 108 before the die package 100 and the redistribution layer 204 are bonded together.

In some embodiments, after the bonding process there may be a small gap between the die package 100 and the redistribution layer 204 caused by the standoff height of the bonding structures 222. In other embodiments, there may be no gap between the die package 100 and the redistribution layer 204.

Typically, the redistribution layer would be formed directly on the die package and the processes involved in forming the redistribution layer (e.g. passivation etching, passivation curing, metal line deposition, etc.) can cause significant warpage. However, in the disclosed embodiments, by forming the redistribution layer 204 on a carrier substrate 202, and bonding the formed redistribution layer 204 to the die package 100, the warpage of the package 300 can be reduced. For example, the carrier substrate 202 can be selected such that it is very rigid and will have very minimal to no warpage during the formation of the redistribution layer 204. In addition, a carrier substrate 202 can be selected such that it has a similar coefficient of thermal expansion (CTE) to the redistribution layer 204 and, will thus, minimize the warpage from any CTE mismatch.

Figure 3C:
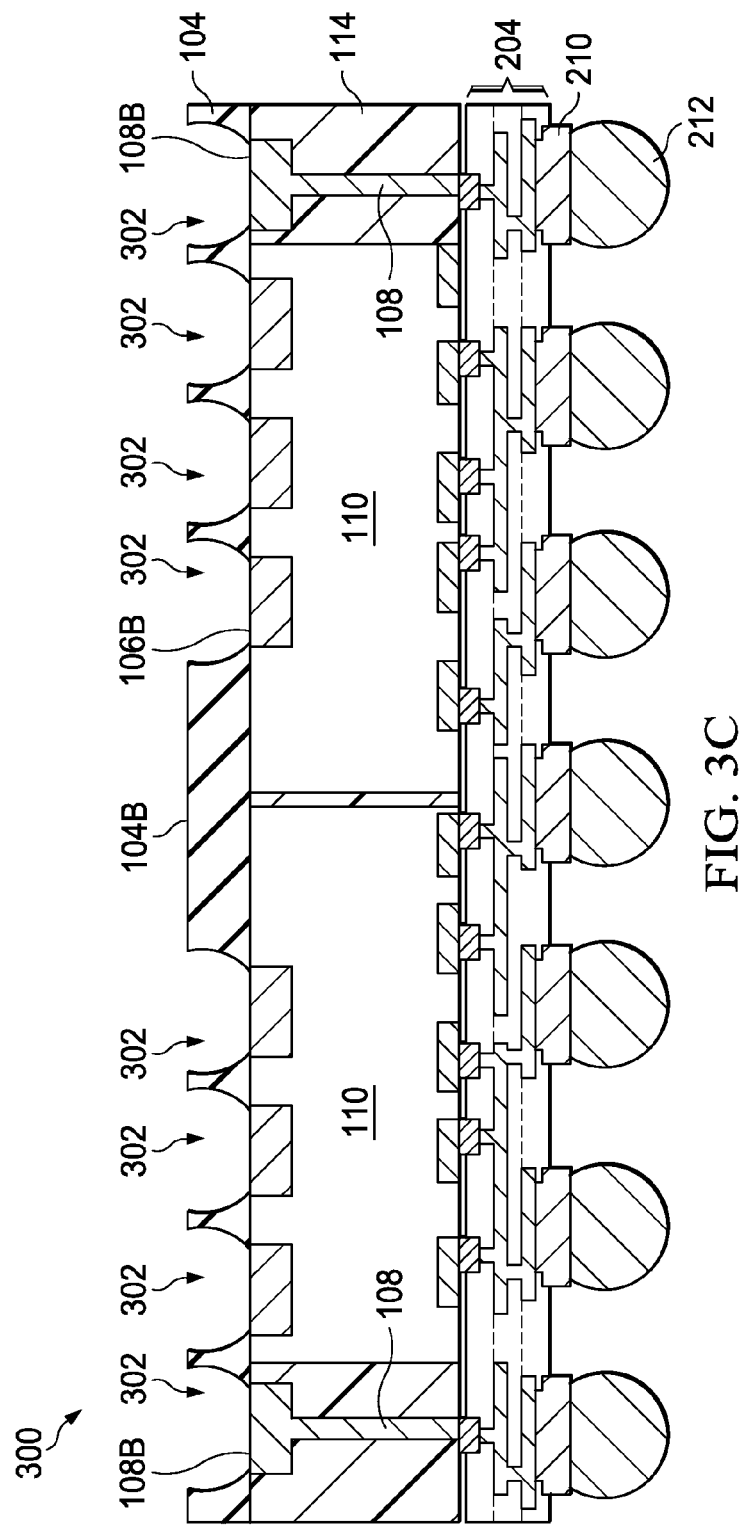

FIG. 3C illustrates removing the carrier substrate 102 to expose a second side 104B of the dielectric layer 104. After the carrier substrate 102 is removed, openings 302 are formed from the second side 104B of the dielectric layer 104 to expose surfaces 108B of the TIVs 108 and surfaces 106B of the bond pads 106. The openings 220 may be formed a laser drill process, an etch process, the like, or a combination thereof.

Figure 3D:
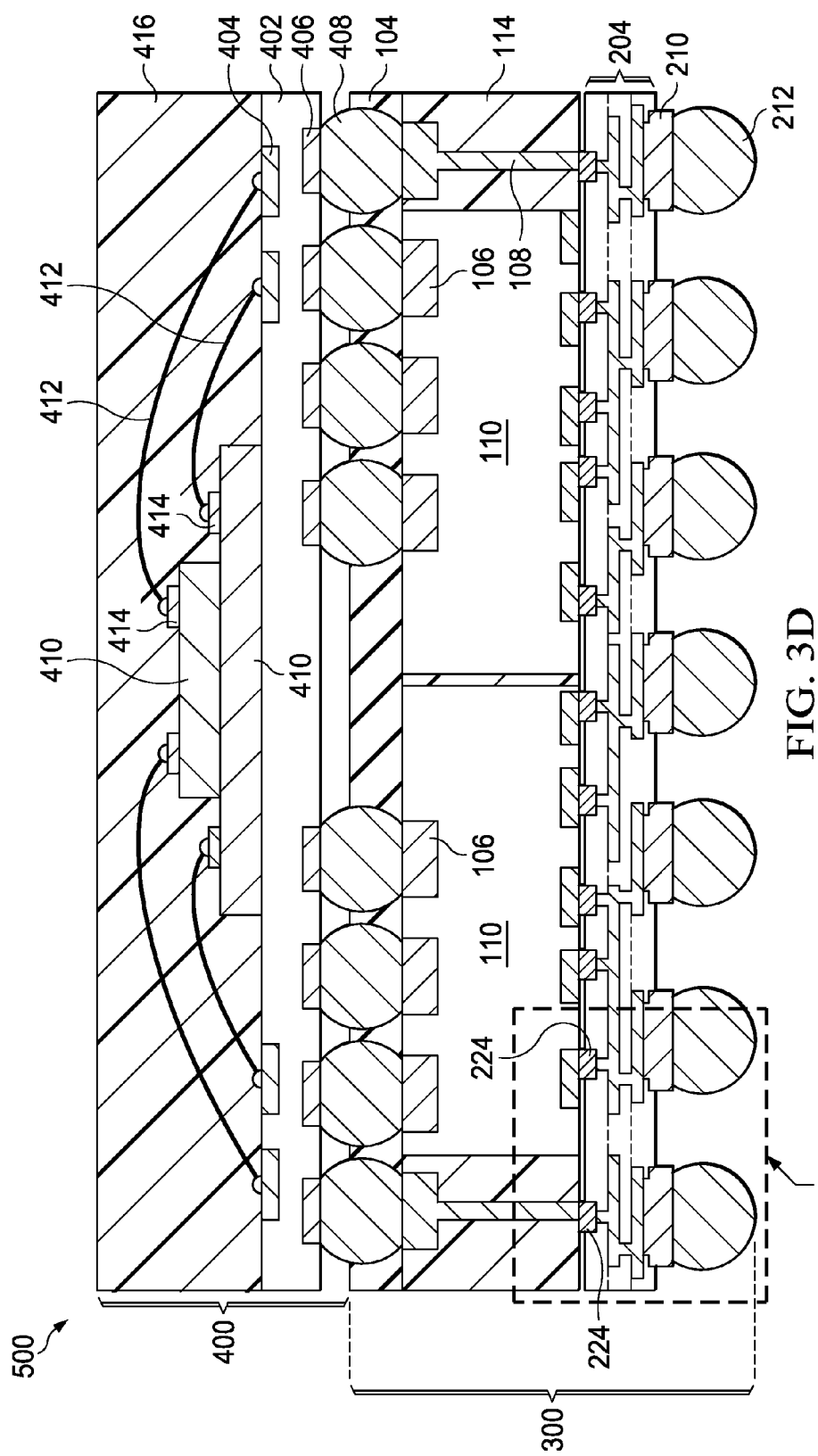

FIG. 3D illustrates bonding a package 400 to the package 300 with a set of connectors 408 extending through the openings 302. The package 400 includes a substrate 402 and one or more stacked dies 410 coupled to the substrate 402.

The substrate 402 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 402 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 402 is, in one alternative embodiment, based on an insulating core such as a fiberglass reinforced resin core. One example core material is fiberglass resin such as FR4. Alternatives for the core material include bismaleimide-triazine (BT) resin, or alternatively, other PC board materials or films. Build up films such as Ajinomoto build-up film (ABF) or other laminates may be used for substrate 402. The substrate 402 may be referred to as a package substrate 402.

The substrate 402 may include active and passive devices (not shown in FIG. 3D). As one of ordinary skill in the art will recognize, a wide variety of devices such as transistors, capacitors, resistors, combinations of these, and the like may be used to generate the structural and functional requirements of the design for the package 400. The devices may be formed using any suitable methods.

The substrate 402 may also include metallization layers (not shown). The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 402 is substantially free of active and passive devices.

The substrate 402 may have bond pads 404 on a first side the substrate 402 to couple to the stacked dies 410, and bond pads 406 on a second side of the substrate 402, the second side being opposite the first side of the substrate 402, to couple to the conductive connectors 408. The bond pads 404 and 406 may be similar to the bond pads 106 described above and the description is not repeated herein, although the bond pads 404, 406, and 106 need not be the same.

In the illustrated embodiment, the stacked dies 410 are coupled to the substrate 402 by with contact pads 414 and wire bonds 412, although other connections may be used, such as conductive bumps. In an embodiment, the stacked dies 410 are stacked memory dies. For example, the stacked memory dies 410 may include low-power (LP) double data rate (DDR) memory modules, such as LPDDR1, LPDDR2, LPDDR3, or the like memory modules.

In some embodiments, the stacked dies 410 and the wire bonds 412 may be encapsulated by a molding material 416. The molding material 416 may be molded on the stacked dies 410 and the wire bonds 412, for example, using compression molding. In some embodiments, the molding material 416 is a molding compound, a polymer, an epoxy, silicon oxide filler material, the like, or a combination thereof. A curing step may be performed to cure the molding material 416, wherein the curing may be a thermal curing, a UV curing, the like, or a combination thereof.

In some embodiments, the stacked dies 410 and the wire bonds 412 are buried in the molding material 416, and after the curing of the molding material 416, a planarization step, such as a grinding, is performed to remove excess portions of the molding material 416 and provide a substantially planar surface for the package 400.

After the package 400 is formed, the package 400 is bonded to package 300 by way of conductive connectors 408, the bond pads 406, the bond pads 106, and the TIVs 108. In some embodiments, the stacked memory dies 410 may be coupled to the die(s) 110 through the contact pads 414, the wire bonds 412, the bond pads 406 and 404, the conductive connectors 408, the bond pads 106, and the TIVs 108.

The conductive connectors 408 may be similar to the conductive connectors 212 described above and the description is not repeated herein, although the conductive connectors 408 and 212 need not be the same.

The bonding between the package 400 and the package 300 may be a solder bonding or a direct metal-to-metal (such as a copper-to-copper or tin-to-tin) bonding. In an embodiment, the package 400 is bonded to the package 300 by a reflow process. During this reflow process, the conductive connectors 408 are in contact with the bond pads 406 and 106, and the TIVs 108 to physically and electrically couple the package 400 to the package 300.

An underfill material (not shown) may be injected or otherwise formed in the space between the package 400 and the package 300 and surrounding the conductive connectors 408. The underfill material may, for example, be a liquid epoxy, deformable gel, silicon rubber, or the like, that is dispensed between the structures, and then cured to harden. This underfill material is used, among other things, to reduce damage to and to protect the conductive connectors 408.

It should be noted that the number of semiconductor dies (e.g., semiconductor die(s) 110 and 410), through InFO vias (e.g., TIVs 108), and conductive connectors (e.g. conductive connectors 212 and 408) shown in FIG. 3D are merely an example. There may be many variations, modifications, and alternatives. For example, a person skilled in the art will recognize that the semiconductor package 500 may accommodate any number of semiconductor dies, TIVs, and conductive connectors.

FIGS. 4A through 4D illustrate a bonding interface between the die package 100 and the redistribution layer 204 in accordance with various embodiments. The portion of package 500 that is illustrated in FIGS. 4A through 4D is the highlighted area of FIG. 3D that is labeled FIG. 4. The bonding structures 600 (e.g. 600A and 600B) in FIGS. 4A through 4D are various embodiments of the bonding structure 222 as illustrated in FIG. 3A before the die package 100 and the redistribution layer 204 are bonded together.

Figure 4A:
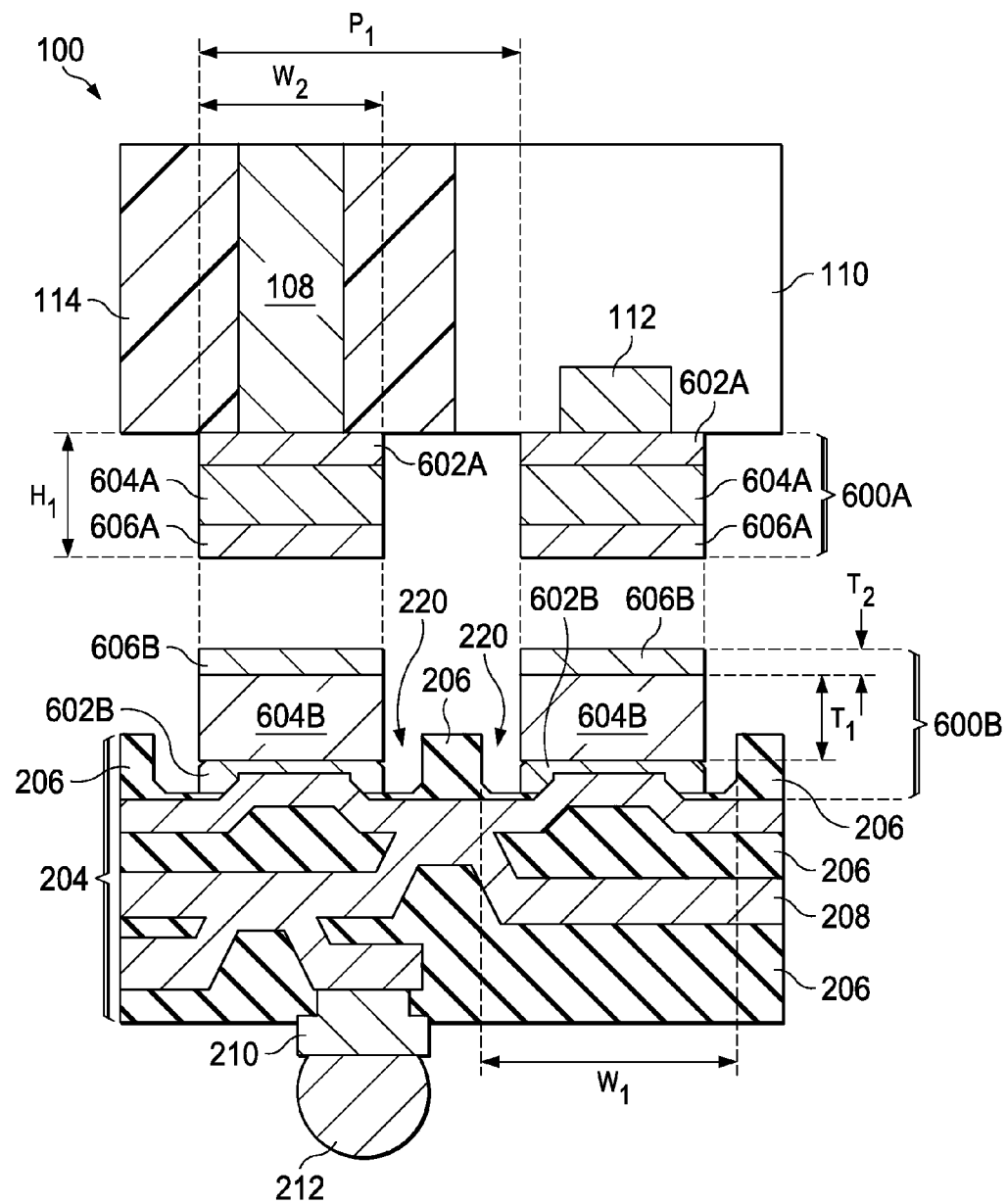
FIGS. 4A through 4D illustrate a bonding interface between the die package from FIGS. 1A through 1D and the redistribution layer from FIGS. 2A through 2E in accordance with various embodiments.

FIG. 4A illustrates the bonding structures 600 of the die package 100 and the redistribution layer 204 wherein the bonding structures 600 are micro bumps. The bonding structures 600A are coupled to the bond pads 106 and the TIVs 108 of the die package 100, and the bonding structures 600B are coupled to the metal lines 208 of redistribution layer 204 in the openings 220 (see FIG. 2D). In an embodiment, the bonding structures 600A and 600B are formed to have a height $H_1$ in a range from about 10 μm to about 40 μm, and a width $W_2$ in a range from about 5 μm to about 50 μm. The bonding structures 600A and 600B can be formed at a pitch $P_1$ in a range from about 10 μm to about 300 μm.

In the illustrated embodiment, both the bonding structures 600A and 600B are micro bumps including seed layers 602 (602A and 602B), conductive layers 604 (604A and 604B), and cap layers 606 (606A and 606B). The bonding structures 600B coupled to the redistribution layer 204 are formed in the openings 220 (see FIG. 2D), with a portion of a passivation layer 206 separating the two openings 220 illustrated in FIG. 4A. In an embodiment, the openings 220 are formed to have a width $W_1$ in a range from about 25 μm to about 150 μm.

The seed layers 602 may be formed by an electro-chemical plating process, CVD, ALD, PVD, the like, or a combination thereof. The seed layer 602 may be formed of titanium copper alloy, tantalum copper alloy, the like, or a combination thereof.

The conductive layers 604 may be formed on the seed layer 602 by an electro-chemical plating process, CVD, ALD, PVD, the like, or a combination thereof. The conductive layer 604 may be formed of copper, titanium, nickel, gold, the like, or a combination thereof to have a thickness $T_1$ from about 2 μm to about 10 μm.

The cap layers 606 may be formed on the conductive layer 604 by an electro-chemical plating process, CVD, ALD, PVD, the like, or a combination thereof. The cap layer 606 may be formed of tin, nickel, tin-lead, gold, silver, palladium, indium, nickel-palladium-gold, nickel-gold, the like, or a combination thereof to have a thickness $T_2$ from about 3 μm to about 10 μm.

The bonding structures 600A are bonded to the bonding structures 600B by a reflow process. During this reflow process, at least the cap layers 606A of the bonding structures 600A are in contact with at least the cap layers 606B of the bonding structures 600B to physically and electrically couple the die package 100 to the redistribution layer 204 and to form bonding joints 224 from the bonding structures 600A and 600B.

Figure 4B:
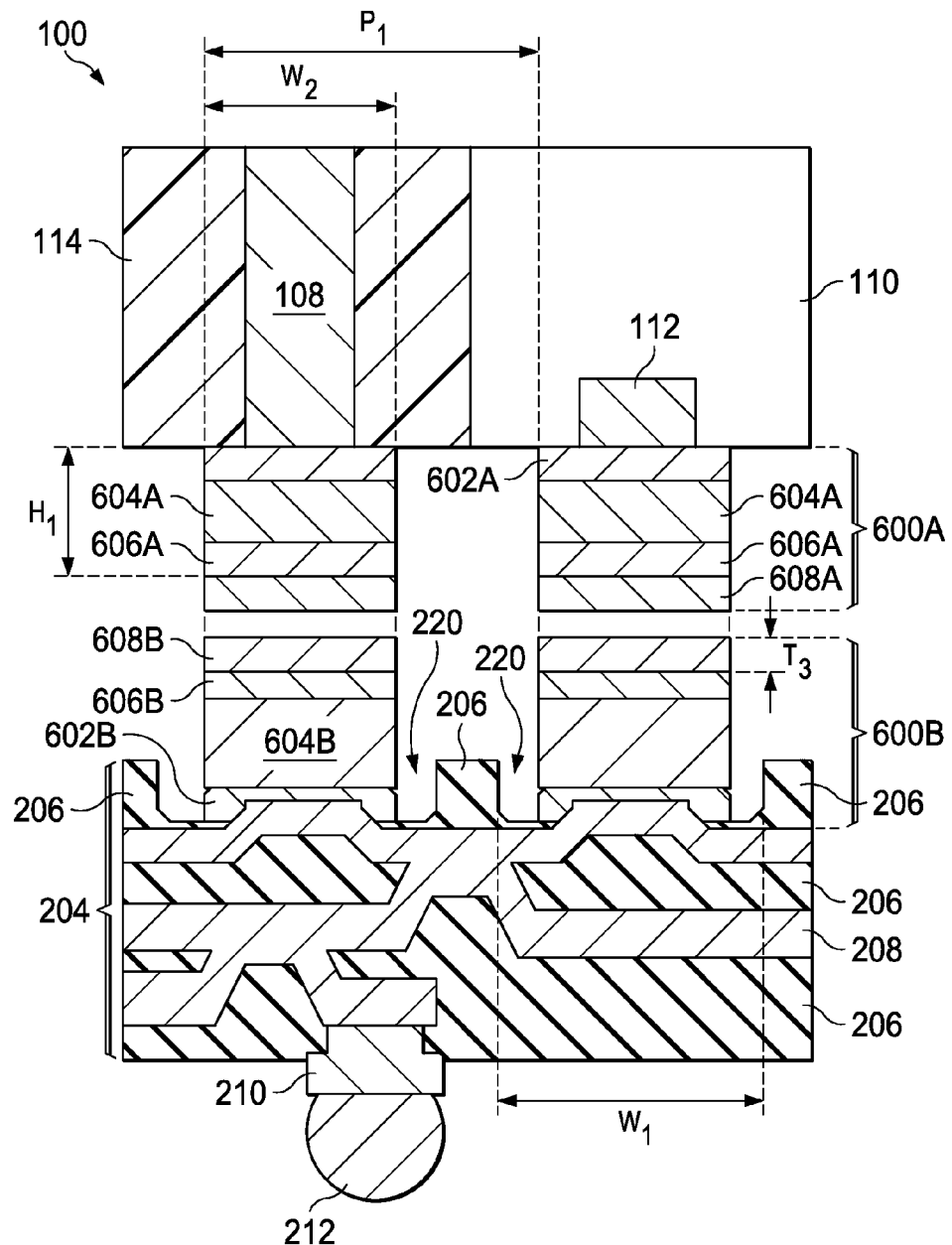

FIG. 4B illustrates the bonding structures 600 of the die package 100 and the redistribution layer 204 wherein the bonding structures 600 are micro bumps with a metal paste layer 608. The bonding structures 600A are coupled to the bond pads 106 and the TIVs 108 of the die package 100, and the bonding structures 600B are coupled to the metal lines 208 of redistribution layer 204 in the openings 220 (see FIG. 2D). In an embodiment, the bonding structures 600A and 600B are formed to have a height $H_1$ in a range from about 50 μm to about 120 μm, and a width $W_2$ in a range from about 70 μm to about 250 μm. The bonding structures 600A and 600B can be formed at a pitch $P_1$ in a range from about 140 μm to about 400 μm.

In the illustrated embodiment, both the bonding structures 600A and 600B are micro bumps including seed layers 602 (602A and 602B), conductive layers 604 (604A and 604B), cap layers 606 (606A and 606B), and metal paste layers 608 (608A and 608B). The bonding structures 600B coupled to the redistribution layer 204 are formed in the openings 220 (see FIG. 2D), with a portion of a passivation layer 206 separating the two openings 220 illustrated in FIG. 4B. In an embodiment, the openings 220 are formed to have a width $W_1$ in a range from about 90 μm to about 400 μm.

The seed layers 602, the conductive layers 604, and the cap layers 606 are similar to the description above in FIG. 4A and the descriptions are not repeated herein.

The metal paste layers 608 may be formed on the cap layers 606 by a metal-paste printing process that is applied to the cap layers 606. According to the locations of the cap layers 606, a stencil may be employed to print the metal paste on top of the cap layers 606. In some embodiments, the metal paste layers 608 are formed in openings of a patterned photo resist (not shown), which is removed after the openings are filled with metal paste. The metal paste layers 608 may be formed of a solder paste, a tin silver paste, flux, the like, or a combination thereof to have a thickness $T_3$ in a range from about 30 μm to about 100 μm.

The bonding structures 600A are bonded to the bonding structures 600B by a reflow process. During this reflow process, at least the metal paste layers 608A of the bonding structures 600A are in contact with at least the metal paste layers 608B of the bonding structures 600B to physically and electrically couple the die package 100 to the redistribution layer 204 and to form bonding joints 224 from the bonding structures 600A and 600B.

The bonding structures 600 including the metal paste layers 608 may improve the quality of the bonding joint 224, but the bonding joints 224 formed from the bonding structures 600 including the metal paste layers 608 may also have an increased height and width.

Figure 4C:
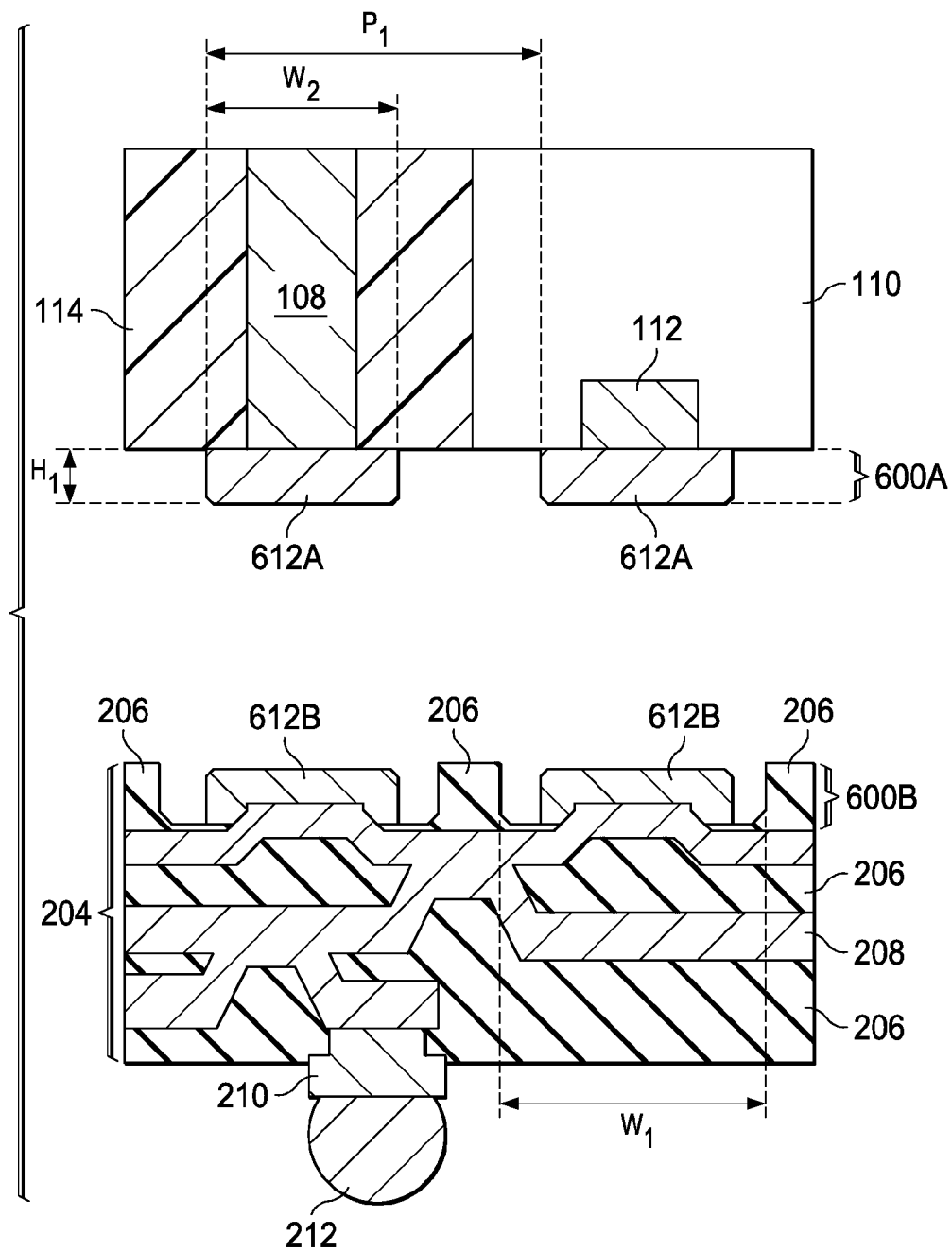

FIG. 4C illustrates the bonding structures 600 of the die package 100 and the redistribution layer 204 wherein the bonding structures 600 are formed of a metal paste layer. The bonding structures 600A are coupled to the bond pads 106 and the TIVs 108 of the die package 100, and the bonding structures 600B are coupled to the metal lines 208 of redistribution layer 204 in the openings 220 (see FIG. 2D). In an embodiment, the bonding structures 600A and 600B are formed to have a height $H_1$ in a range from about 30 μm to about 100 μm, and a width $W_2$ in a range from about 70 μm to about 250 μm. The bonding structures 600A and 600B can be formed at a pitch $P_1$ in a range from about 140 μm to about 400 μm.

In the illustrated embodiment, both the bonding structures 600A and 600B are metal paste layers 612 (612A and 612B). The bonding structures 600B coupled to the redistribution layer 204 are formed in the openings 220 (see FIG. 2D), with a portion of a passivation layer 206 separating the two openings 220 illustrated in FIG. 4C. In an embodiment, the openings 220 are formed to have a width $W_1$ in a range from about 90 μm to about 400 μm.

The metal paste layers 612 may be formed by a metal-paste printing process that is applied to the TIVs 108, the contact areas 112, and/or the metal lines 208. According to the locations of the TIVs 108, the contact areas 112, and/or the metal lines 208, a stencil may be employed to print the metal paste on top of the TIVs 108, the contact areas 112, and/or the metal lines 208. In some embodiments, the metal paste layers 612 are formed in openings of a patterned photo resist (not shown), which is removed after the openings are filled with metal paste. The metal paste layers 612 may be formed of a solder paste, a tin silver paste, flux, the like, or a combination thereof to have the height $H_1$.

The bonding structures 600A are bonded to the bonding structures 600B by a reflow process. During this reflow process, at least the metal paste layers 612A of the bonding structures 600A are in contact with at least the metal paste layers 612B of the bonding structures 600B to physically and electrically couple the die package 100 to the redistribution layer 204 and to form bonding joints 224 from the bonding structures 600A and 600B.

Figure 4D:
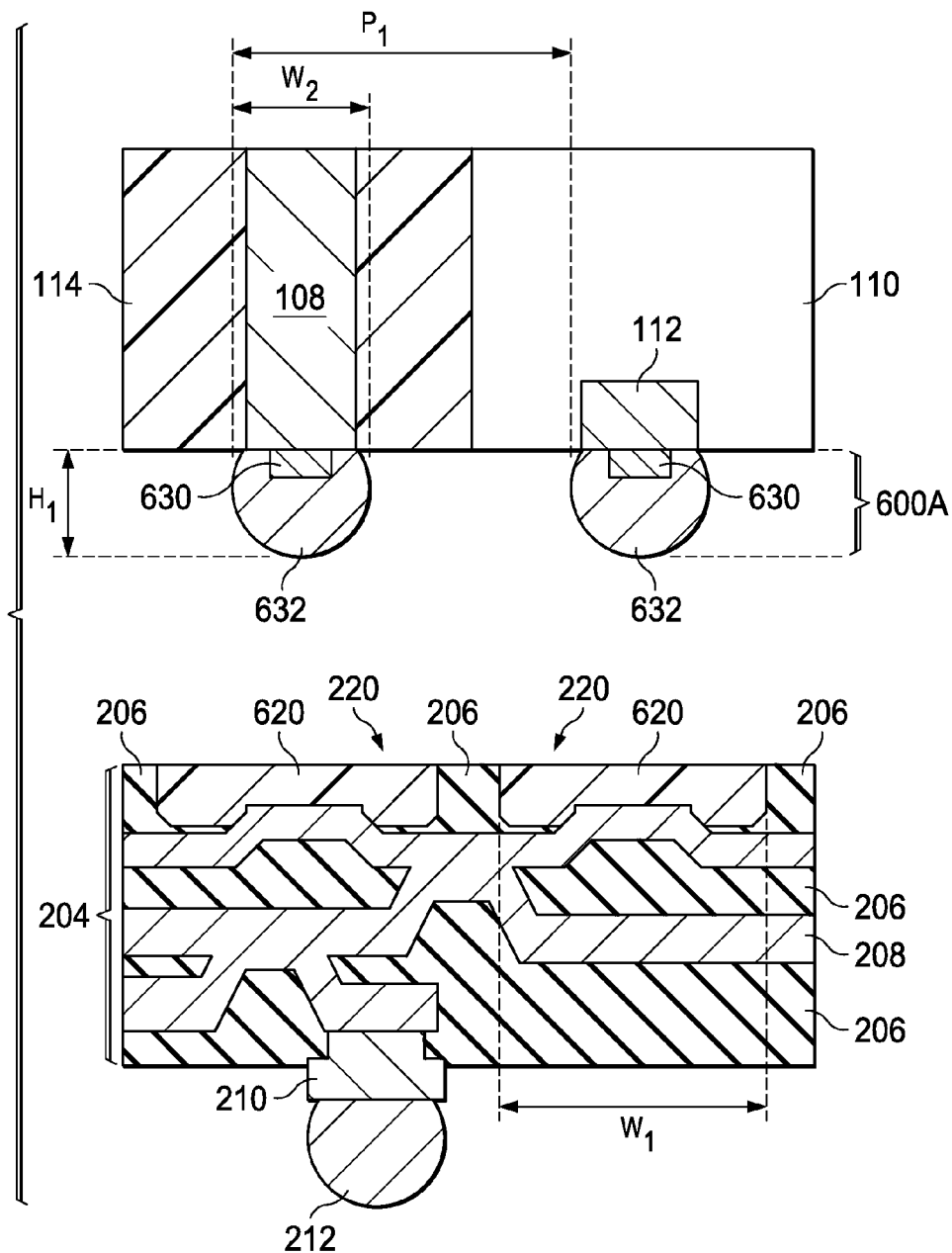

FIG. 4D illustrates the bonding structures 600 of the die package 100 and the redistribution layer 204 wherein the bonding structures 600 are formed of solder bumps. The bonding structures 600A are coupled to the bond pads 106 and the TIVs 108 of the die package 100 and flux 620 is formed in the openings 220 of the redistribution layer 204 (see FIG. 2D). In an embodiment, the bonding structures 600A are formed to have a height $H_1$ in a range from about 20 μm to about 50 μm, and a width $W_2$ in a range from about 40 μm to about 80 μm. The bonding structures 600A can be formed at a pitch $P_1$ in a range from about 80 μm to about 160 μm.

In the illustrated embodiment, the bonding structures 600A are bump structures including UBMs 630 and solder bumps 632 over the UBMs 630. The flux layers 620 are formed in the openings 220 of the redistribution layer 204 (see FIG. 2D), with a portion of a passivation layer 206 separating the two openings 220 illustrated in FIG. 4D. In an embodiment, the openings 220 are formed to have a width $W_1$ in a range from about 25 μm to about 150 μm.

The UBMs 630 may be similar to the UBMs 210 described above and the description is not repeated herein. The solder bumps 632 may be similar to the connectors 212 described above and the description is not repeated herein. In some embodiments, a layer of flux (not shown) may be formed on the contact areas 112 and the TIVs 108 before the solder bumps 632 are formed. The flux layers 620 are formed in the openings 220, and, in some embodiments, the flux layers 620 substantially fill the openings 220.

The bonding structures 600A are bonded to the flux layers 620 by a reflow process. During this reflow process, at least the solder bumps 632 of the bonding structures 600A are in contact with at least the flux layers 620 to physically and electrically couple the die package 100 to the redistribution layer 204 and to form bonding joints 224 from the bonding structures 600A and the flux layers 620.

By forming the redistribution layer on a carrier substrate, and bonding the formed redistribution layer on the die package, the warpage of the bonded package can be significantly reduced. Typically, the redistribution layer would be formed directly on the die package and the processes involved in forming the redistribution layer (e.g. passivation etching, passivation curing, metal line deposition, etc.) can cause significant warpage. However, in the disclosed embodiments, the carrier substrate for the redistribution layer can be selected such that it is very rigid and will have very minimal to no warpage during the formation of the redistribution layer. In addition, the carrier substrate for the redistribution layer can be selected such that it has a similar coefficient of thermal expansion (CTE) to the redistribution layer and, will thus, minimize any warpage from CTE mismatch.

Figure 5C:
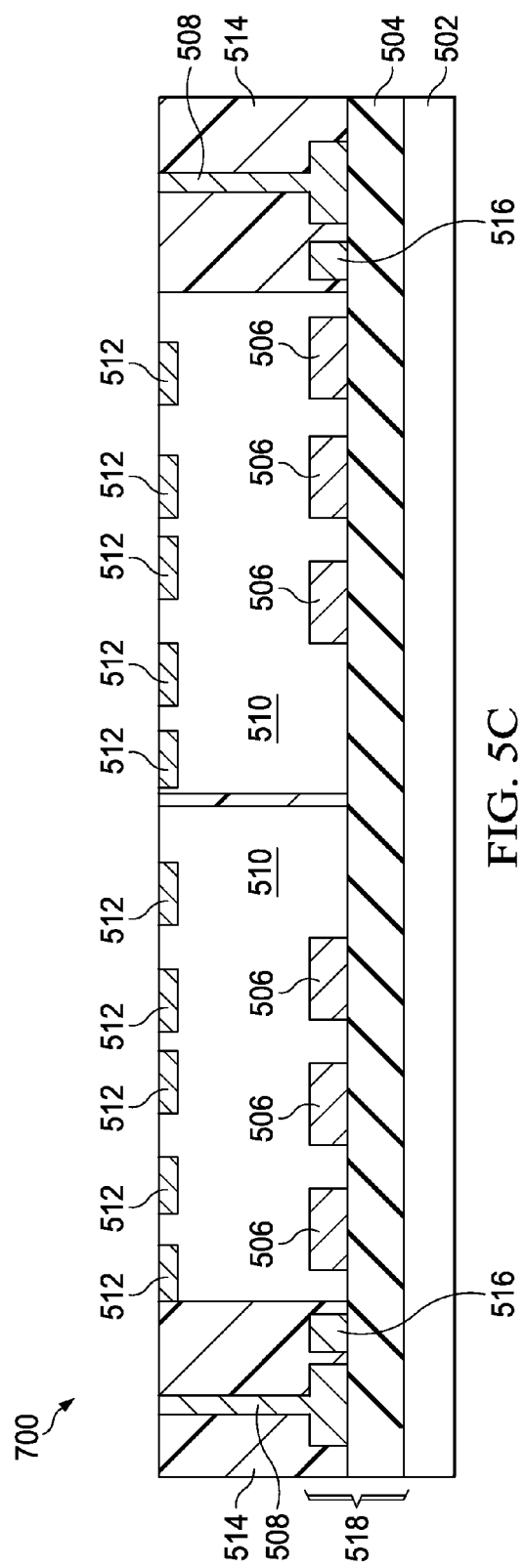

FIGS. 5A through 5C illustrate cross-sectional views of intermediate steps in forming a die package 700 in accordance with some embodiments. Unless noted otherwise, reference numerals "5xx" of FIGS. 5A-5C refer to the same features and processes as reference numerals "1xx" of FIGS. 1A-1D. The die package 700 in FIG. 5A includes a dielectric layer 504 over a carrier substrate 502, and bond pads 506 and electrical connectors 508 over the dielectric layer 504. In the illustrated embodiment, the carrier substrate 502, the dielectric layer 504, the bond pads 506, and the electrical connectors 508 are formed of same materials and methods as the carrier substrate 102, the dielectric layer 104, the bond pads 106, and the electrical connectors 108 described above with reference to FIG. 1A and the description is not repeated herein. In addition, the electrical connectors 508 may be referred to as through molding vias (TMVs), through package vias (TPVs), and/or through InFO vias (TIVs) and will be referred to as TIVs 508 hereinafter. In some embodiments, the TIVs 508 may have a width between about 100 μm and about 300 μm.

Referring further to FIG. 5A, alignment structures 516 are formed on the dielectric layer 504. In some embodiments, the alignment structures 516 are formed of same materials and methods as the bond pads 106 described above with reference to FIG. 1A and the description is not repeated herein. In some embodiments, the bond pads 506 and the alignment structures 516 are a part of a back-side redistribution layer (RDL) 518. As described below in greater detail, the alignment structures 516 are used to precisely align one or more dies over the back-side RDL 518. In some embodiments, the alignment structures 516 are dummy structures in the sense that the alignment structures 516 are not electrically coupled to the bond pads 506 and/or the TIVs 508. In other embodiments, the alignment structures 516 may be electrically coupled to the bond pads 506 and subsequently attached packages through the TIVs 508. In the illustrated embodiment, the alignment structures 516 are formed at a first distance D1 from a nearest one of the TIVs 508, and at a second distance D2 from a nearest one of the bond pads 506. In some embodiments, the first distance D1 is more than about 60 μm, and the second distance D2 is more than about 40 μm.

Referring to FIG. 5B, one or more dies 510 are attached to the back-side RDL 518. In some embodiments, the die(s) 510 may be similar to the die(s) 110 and may be attached to the back-side RDL 518 using methods described above with reference to FIG. 1B and the description is not repeated herein. In other embodiments, the die(s) 510 may be attached to the back-side RDL 518 using, for example, an adhesive layer or the like (not shown). In some embodiments, the die(s) 510 is attached to the back-side RDL 518 using, for example, a pick and place apparatus. The alignment structures 516 are used to precisely align the die(s) 510 on the back-side RDL 518 to avoid, for example, shift and/or rotation of the die(s) 510, which may induce electrical failures of the die package 700. As illustrated in FIG. 5B, the die(s) 510 is not bonded to the alignment structures 516. The alignment structures 516 are still visible after the die(s) 510 is attached, as viewed from above.

FIG. 5C illustrates the encapsulation of the die(s) 510 and the TIVs 508. In some embodiments, the die(s) 510 and the TIVs 508 are encapsulated by a molding material 514. The molding material 514 may be molded on the die(s) 510, the TIVs 508, and the alignment structures 516 using methods similar to those described above with reference to FIG. 1C and the description is not repeated herein. In some embodiments, the molding material 514 directly adjoining a top surface and sidewalls of the alignment structures 516. In some embodiments, the molding material 514 may be made of materials similar to those of the molding material 114 described above with reference to FIG. 1C. Subsequently, the molding material 514 is planarized using methods described above with reference to FIG. 1D and the description is not repeated herein.

Figure 6A:
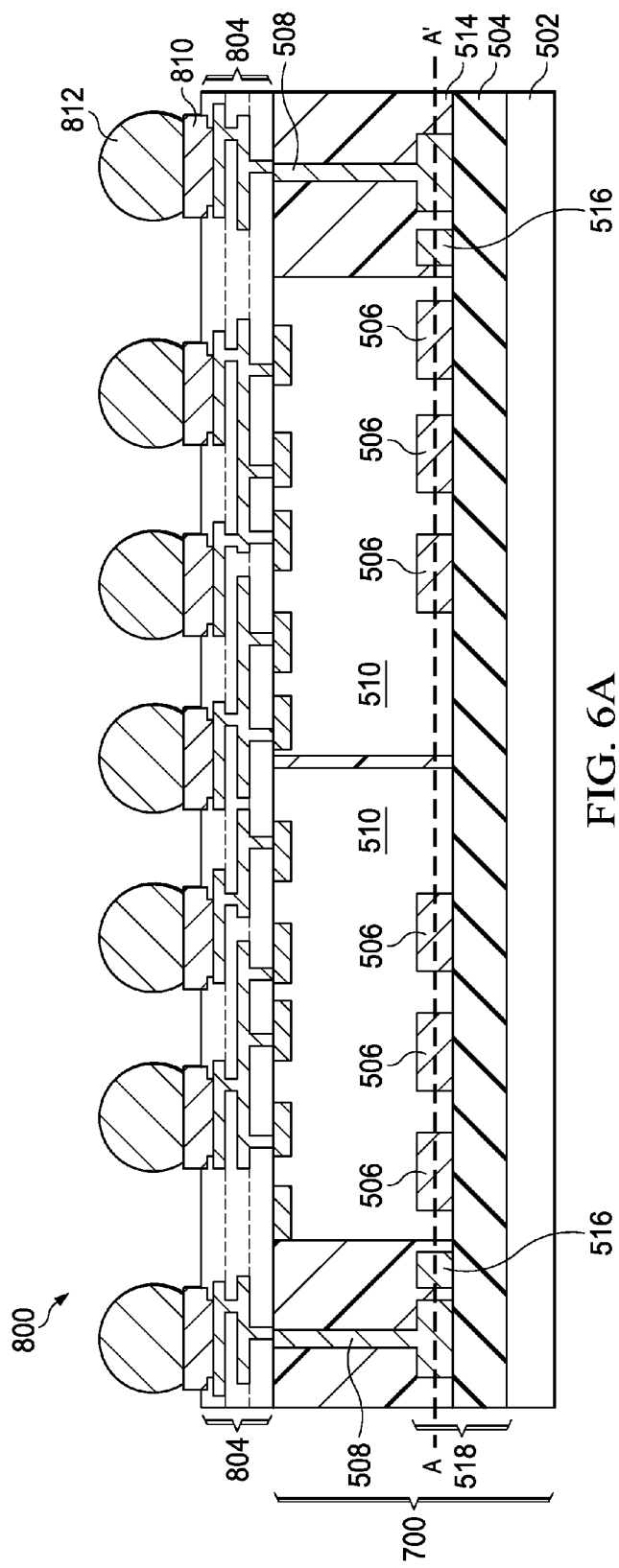
FIGS. 6A and 6B illustrate cross-sectional views of intermediate steps in forming a semiconductor package including the die package from FIGS. 5A through 5C in accordance with some embodiments.
Figure 6B:
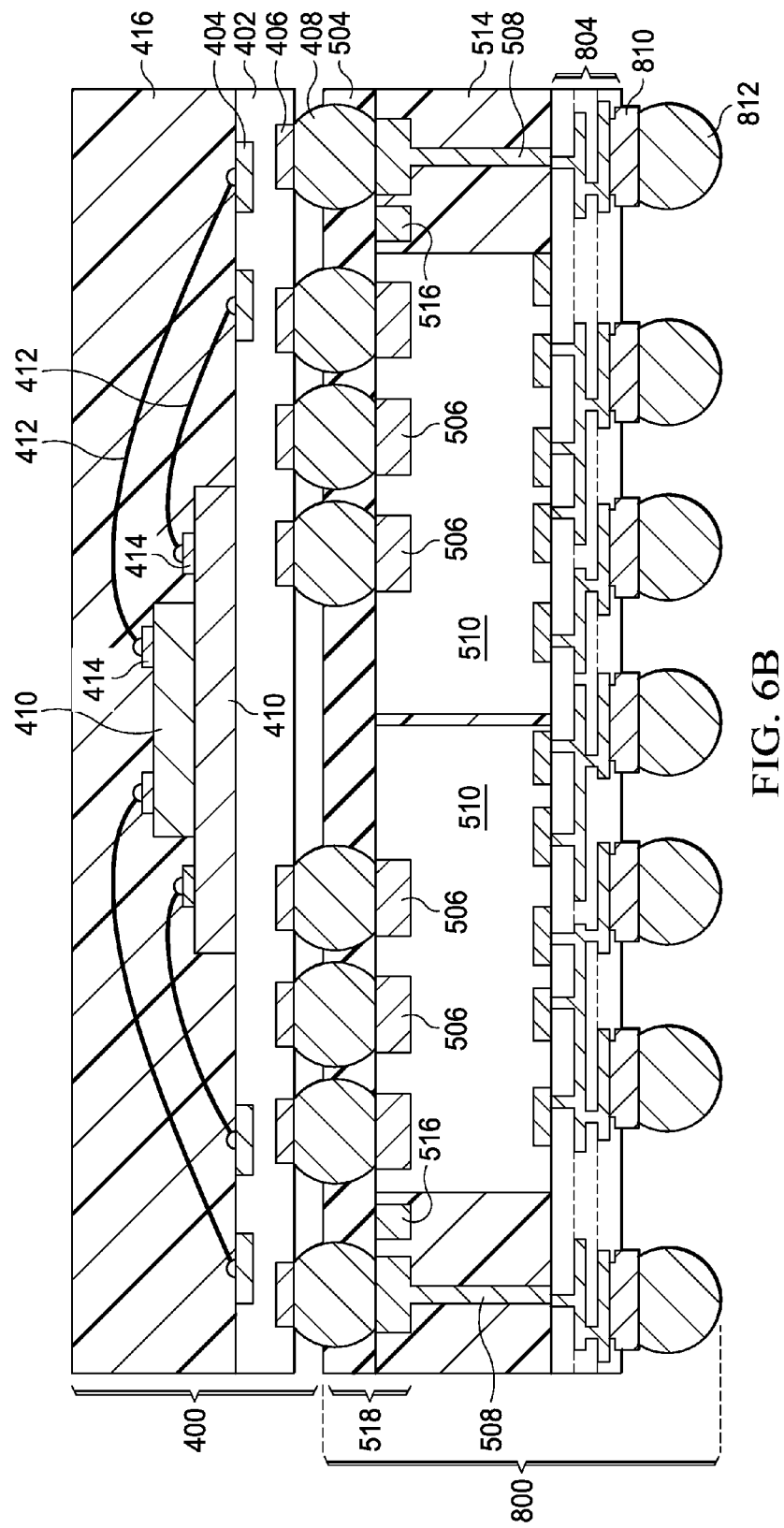
Figure 6C:
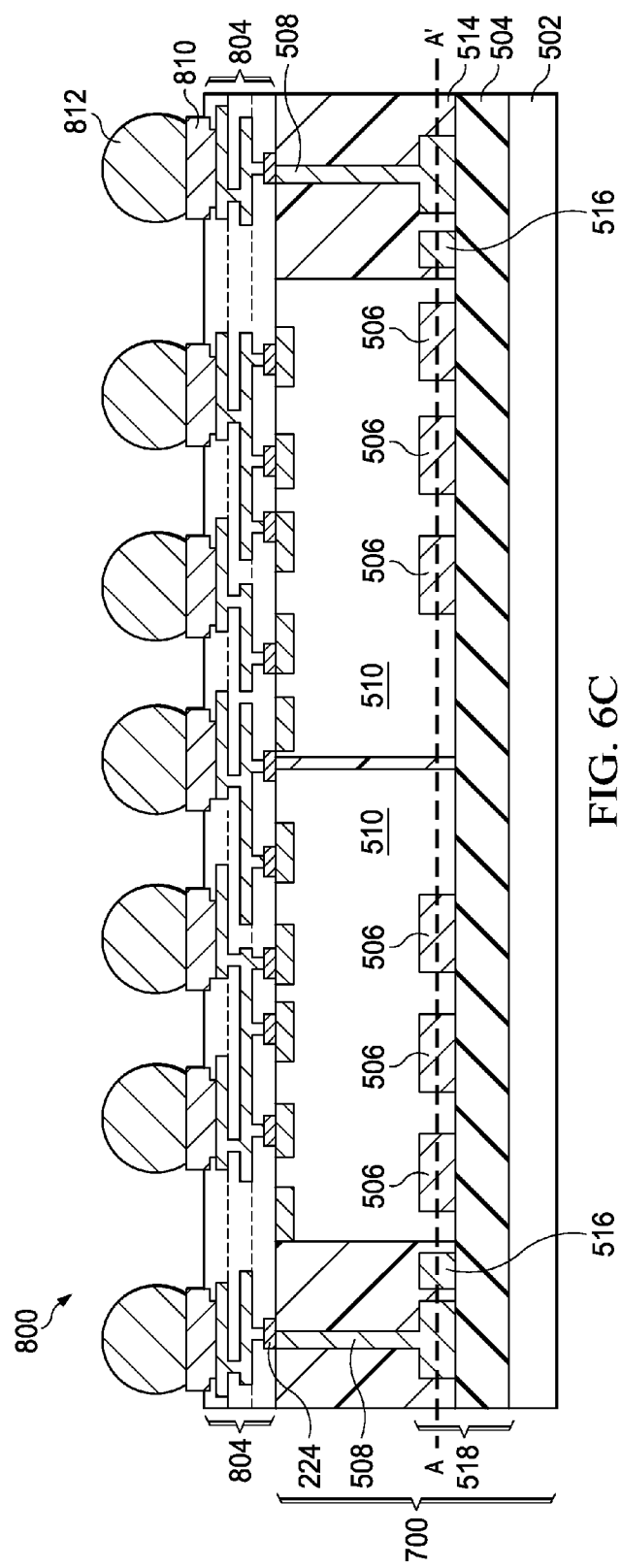
FIGS. 6C and 6D illustrate cross-sectional views of intermediate steps in forming a semiconductor package including the die package from FIGS. 5A through 5C in accordance with some embodiments.

Referring to FIGS. 6A and 6C, a front-side redistribution layer (RDL) 804 is formed over the die package 700 to form a package 800. Unless noted otherwise, reference numerals "8xx" of FIGS. 6A and 6C refer to the same features and processes as reference numerals "2xx" of FIGS. 2A-2E. In some embodiments, the front-side RDL 804 may be formed of same materials and methods as the RDL 204 described above with reference to FIGS. 2A-2E and the description is not repeated herein. Subsequently, as illustrated in FIG. 6C the front-side RDL 804 may be attached to the die package 700 using a method similar to that described above with reference to FIGS. 3A and 3B and the description is not repeated herein. In other embodiments, the front-side RDL 804 may be directly formed over the die package 700 as illustrated in FIG. 6A.

Referring further to FIG. 6A, UBMs 810 are formed over and electrically coupled to the front-side RDL 804 using a method similar to one described above with reference to FIG. 2C and the description is not repeated herein. Subsequently, connectors 812 are formed over and electrically coupled to the UBMs 810 using a method similar to one described above with reference to FIG. 2C and the description is not repeated herein.

Figure 6D:
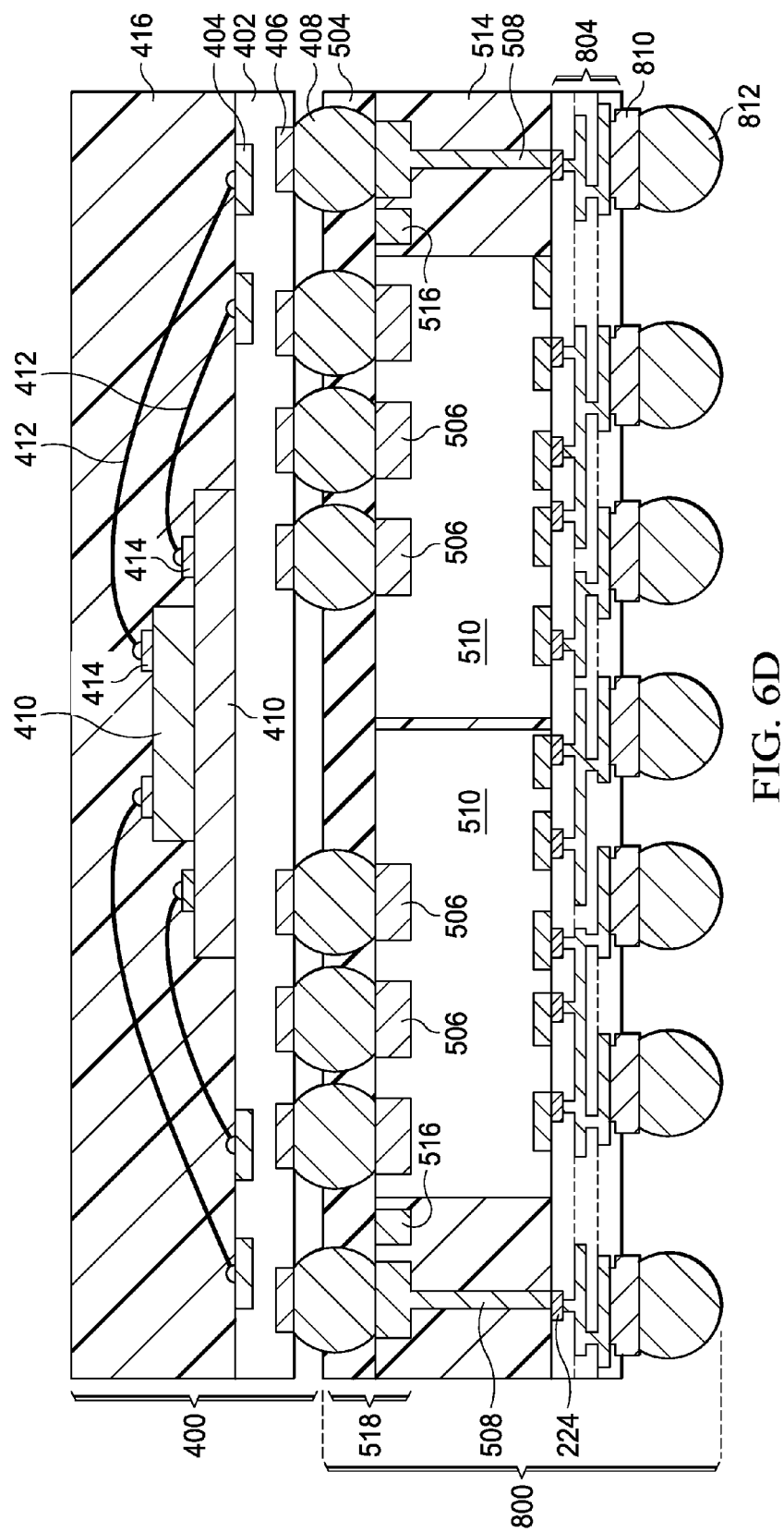

FIGS. 6B and 6D illustrate the package 400 bonded to the package 800 of FIGS. 6A and 6C, respectively, to form, for example, a package-on-package device. The package 400 is attached to the package 800 using a method similar to one described above with reference to FIGS. 3B-3D and the description is not repeated herein.

FIGS. 7A-7E illustrate planar views of the package 800 (along a line AA' in FIG. 6A) showing exemplary shapes and arrangements of the alignment structures 516. For clarity of description, the bond pads 506, the electrical connectors 508, and the die(s) 510 are not shown in FIGS. 7A-7E. It should be understood that the shapes and arrangements of the alignment structures 516 shown in FIGS. 7A-7E are provided for illustrative purposes only, and other arrangements and shapes are also possible.

Referring further to FIGS. 7A-7E, the alignment structures 516 are formed outside of and around a chip area 701 of the back-side RDL 518, the chip area 701 being an area of the back-side RDL 518 where the die(s) 510 is mounted (as viewed from above). In the illustrated embodiment, the alignment structures 516 are located at a third distance D3 from first edges 703 of the package 800, and at a fourth distance D4 from second edges 705 of the chip area 701. In some embodiments, the third distance D3 is larger than about 300 µm, and the fourth distance D4 is between about 20 µm and about 50 µm. In addition, each of the alignment structures 516 has a third width W3 larger than about 10 µm, and a maximum dimension L less than about 40 µm.

Figure 7B:
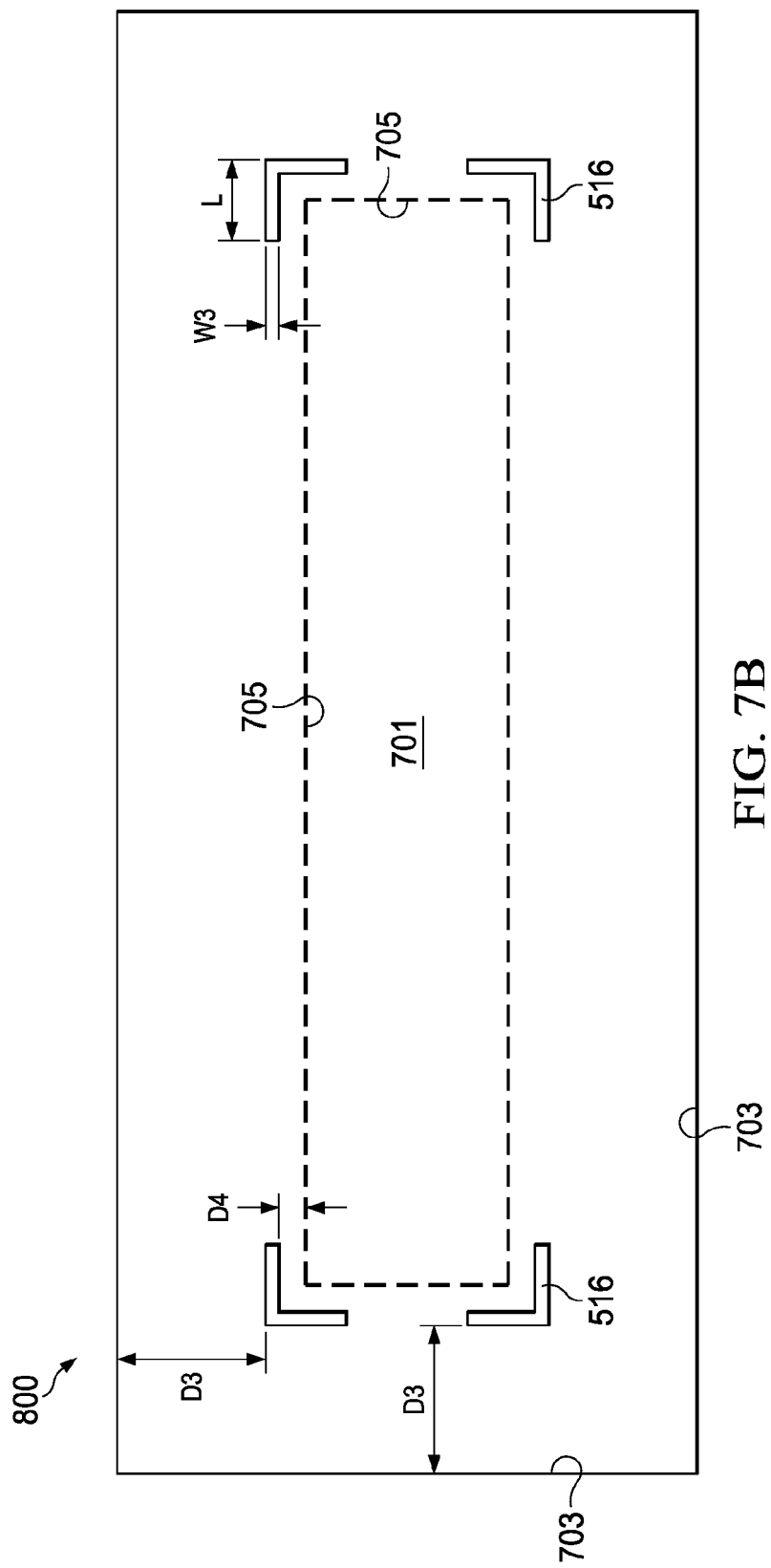
Figure 7D:
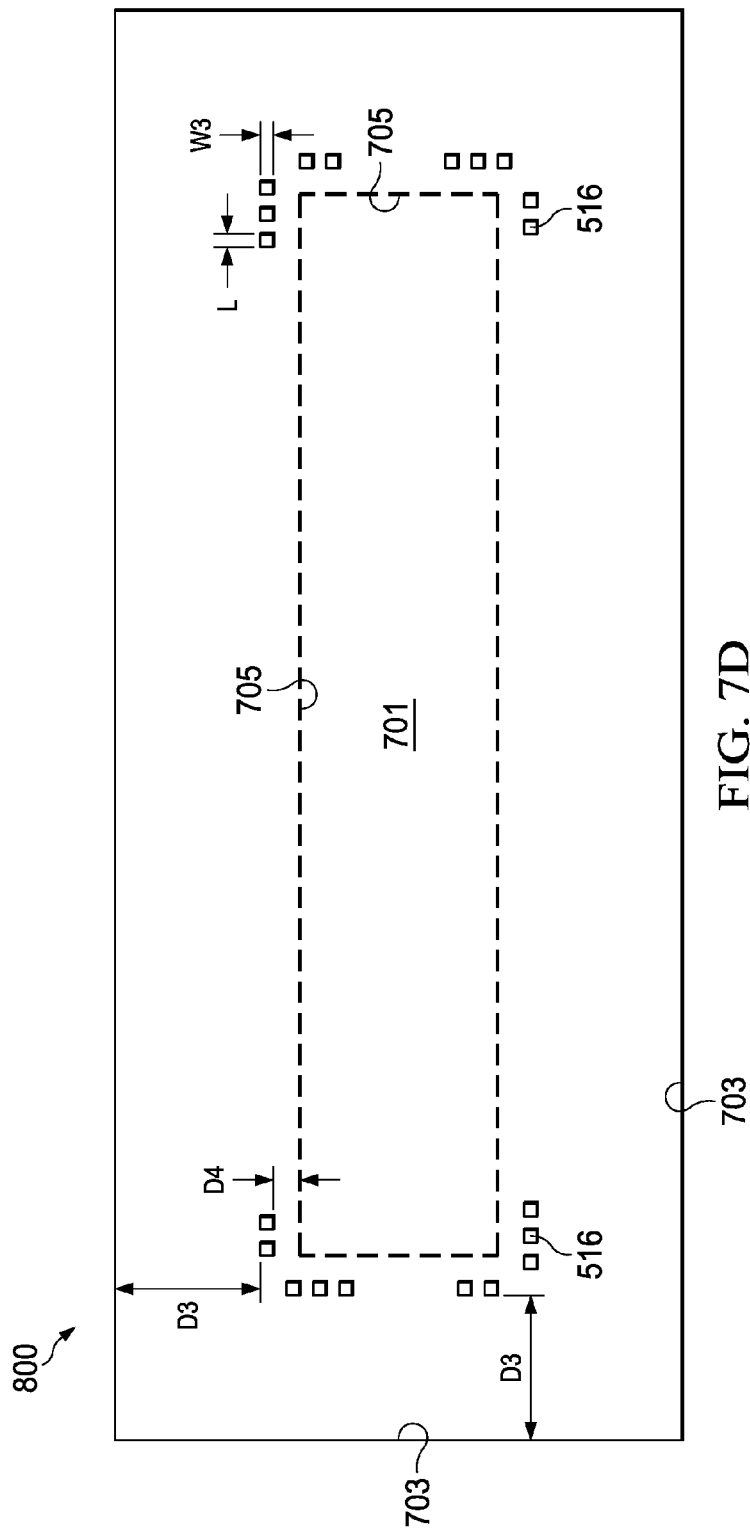
Figure 7E:
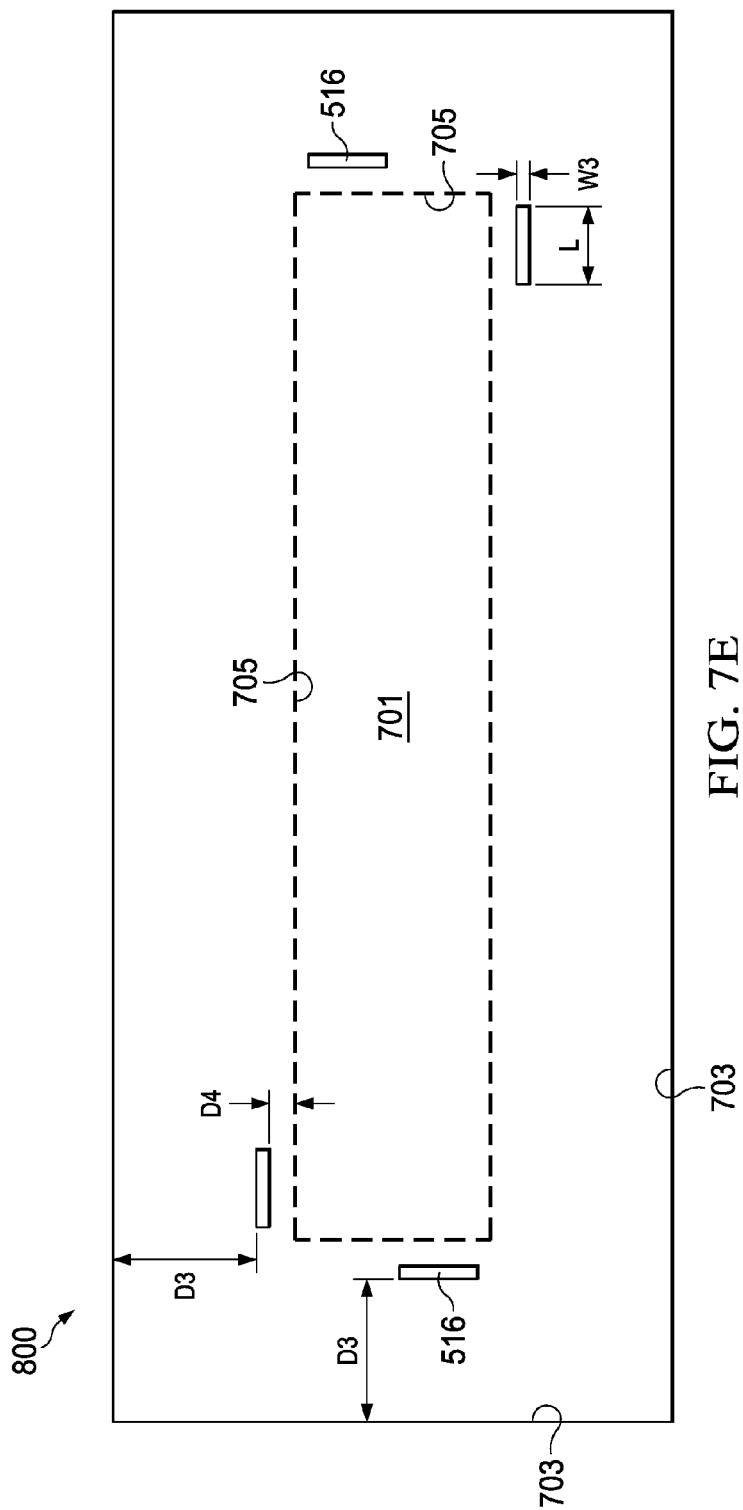

In an embodiment, the alignment structures 516 are cross-shaped structures as illustrated in FIG. 7A, and are formed adjacent the corners of the chip are 701. In another embodiment, the alignment structures 516 are L-shaped structures as illustrated in FIG. 7B, with each of the alignment structures 516 having a first segment and a second segment, the first segment being substantially perpendicular to the second segment. In other embodiments, the alignment structures 516 are rectangular-shaped structures as illustrated in FIGS. 7C-7E. It should be understood that the shapes of the alignment structures 516 described above are provided for illustrative purposes only, and the alignment structures 516 may have other shapes.

The alignment structures as described above may be used to precisely align dies during a packaging process to form an integrated circuit package. For example, the precise alignment may help to avoid, for example, shift and/or rotation of the dies, and thus may help to avoid electrical failures of the integrated circuit package due to the misalignment of the dies.

An embodiment is a semiconductor package including a first package including one or more dies, and a redistribution layer coupled to the one or more dies at a first side of the first package with a first set of bonding joints. The redistribution layer including more than one metal layer disposed in more than one passivation layer, the first set of bonding joints being directly coupled to at least one of the one or more metal layers, and a first set of connectors coupled to a second side of the redistribution layer, the second side being opposite the first side.

Another embodiment is a semiconductor package including a die package including a first die having a first side and a second side, the second side being opposite the first side, an encapsulant surrounding the first die and having a first side substantially level with the first side of the first die and a second side substantially level with the second side of the first die, and a through package via extending through the encapsulant from the first side to the second side of the encapsulant. The semiconductor package further includes a redistribution layer bonded to the first side of the first die and the through package via with a set of bonding joints, the redistribution layer comprising a plurality of metal layers disposed in a plurality of passivation layers, each of the set of bonding joints being directly coupled to a first metal layer of the plurality of metal layers.

A further embodiment is a method including forming a first die package over a first carrier substrate, the first die package comprising a first die and a first electrical connector, forming redistribution layer over a second carrier substrate, the redistribution layer including one or more metal layers disposed in one or more passivation layers, and removing the second carrier substrate from the redistribution layer to expose a first passivation layer of the one or more passivation layers. The method further includes forming openings in the first passivation layer to expose portions of a first metal layer of the one or more metal layers, forming a first set of bonding structures in the openings in the first passivation layer, the first set of bonding structures being coupled to the first metal layer, and bonding the redistribution layer to the first die package using the first set of bonding structures to form a first set of bonding joints, at least one of the first set of bonding joints being bonded to the first die of the first die package and at least another one of the first set of bonding joints being bonded to the first electrical connector.

In an embodiment, a semiconductor device comprises a first package comprising one or more first dies, and a first redistribution layer coupled to the one or more first dies at a first side of the first package, the first redistribution layer comprising more than one conductive layer disposed in more than one passivation layer. The semiconductor device further comprises a second redistribution layer coupled to the one or more first dies at a second side of the first package, the second side being opposite the first side, the second redistribution layer comprising one or more conductive features, and one or more alignment structures in the second redistribution layer, the one or more alignment structures being electrically decoupled from the one or more conductive features in the second redistribution layer.

In another embodiment, a semiconductor device comprises a die package. The die package comprises a first redistribution layer having a first side, the first side having a first area and a second area surrounding the first area, wherein the first redistribution layer comprises an alignment structure in the second area, and a first die bonded to the first side of the first redistribution layer in the first area. The semiconductor device further comprises a second redistribution layer having a second side, wherein the first die is bonded to the second side of the second redistribution layer with a set of bonding joints, the second redistribution layer comprising a plurality of metal layers disposed in a plurality of passivation layers, each of the set of bonding joints being directly coupled to a first metal layer of the plurality of metal layers.

In yet another embodiment, a method comprises forming a first redistribution layer over a first carrier substrate, the first redistribution layer having a first side, the first side having a first area and a second area surrounding the first area, forming an alignment structure on the first side of the first redistribution layer in the second area, and aligning a first die over the first side of the first redistribution layer in the first area using the alignment structure as an alignment mark. The method further comprises bonding the first die to the first side of the first redistribution layer in the first area, forming a second redistribution layer, and bonding the second redistribution layer to the first die using a set of bonding structures to form a set of bonding joints, at least one of the set of bonding joints being bonded to the first die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first redistribution layer over a first carrier substrate, the first redistribution layer having a first side, the first side having a first area and a second area surrounding the first area;
    forming an alignment structure on the first side of the first redistribution layer in the second area;
    forming an electrical connector on the first side of the first redistribution layer in the second area;
    after forming the alignment structure and the electrical connector, aligning a first die over the first side of the first redistribution layer in the first area using the alignment structure as an alignment mark, the alignment structure being located at a first distance from the first die, the electrical connector being located at a second distance from the first die, the second distance being greater than the first distance;
    bonding the first die to the first side of the first redistribution layer in the first area;
    forming a second redistribution layer; and
    after forming the second redistribution layer, bonding the second redistribution layer to the first die using a set of bonding structures to form a set of bonding joints, at least one of the set of bonding joints being bonded to the first die.

2. The method of claim 1, wherein the first redistribution layer has one or more bond pads formed on the first side of the first redistribution layer, the one or more bond pads and the alignment structure being formed by a same process, the first die being bonded to the one or more bond pads.

3. The method of claim 1, wherein the forming the second redistribution layer comprises:
    forming one or more metal layers disposed in one or more passivation layers over a second carrier substrate;
    removing the second carrier substrate to expose a first passivation layer of the one or more passivation layers;
    forming openings in the first passivation layer to expose portions of a first metal layer of the one or more metal layers; and
    forming the set of bonding structures in the openings in the first passivation layer, the set of bonding structures being coupled to the first metal layer.

4. The method of claim 1, further comprising:
    encapsulating the first die, the electrical connector, and the alignment structure with a molding material, the molding material being interposed between the first redistribution layer and the second redistribution layer, the electrical connector extending through the molding material.

5. The method of claim 1, further comprising:
    removing the first carrier substrate from the first redistribution layer to expose a second side of the first redistribution layer, the second side being opposite the first side;
    forming openings from the second side of the first redistribution layer to expose bond pads of the first redistribution layer; and
    bonding a package to the first redistribution layer using conductive connectors, the conductive connectors extending through the openings in the second side of the first redistribution layer.

6. A method comprising:
    forming a first redistribution layer over a first carrier, the first redistribution layer having one or more conductive features and one or more alignment structures, the one or more alignment structures being electrically decoupled from the one or more conductive features;
    forming a through via over the first redistribution layer;

after forming the through via over the first redistribution layer, attaching one or more dies to the first redistribution layer, the one or more alignment structures being used to align the one or more dies on the first redistribution layer, at least one alignment structure of the one or more alignment structures being interposed between the through via and the one or more dies;

forming an encapsulant on the first redistribution layer, the encapsulant extending along sidewalls of the one or more dies, the encapsulant extending along sidewalls and top surfaces of the one or more alignment structures; and forming a second redistribution layer over the one or more dies and the encapsulant, the one or more dies being interposed between the first redistribution layer and the second redistribution layer.

7. The method of claim 6, further comprising attaching a package to the second redistribution layer, the second redistribution layer being interposed between the package and the one or more dies.

8. The method of claim 6, wherein the one or more dies are coupled to the first redistribution layer at a first area, the first area being free from the one or more alignment structures.

9. The method of claim 8, wherein the one or more alignment structures are located at a first distance from edges of the first area, the first distance being between about 20 µm and about 50 µm.

10. The method of claim 6, wherein the forming the second redistribution layer comprises:
    forming one or more metal layers disposed in one or more dielectric layers over a second carrier;
    removing the second carrier to expose a first dielectric layer of the one or more dielectric layers;
    patterning the first dielectric layer to form opening in the first dielectric layer, the openings exposing a first metal layer of the one or more metal layers;
    forming bonding structures in the openings, the bonding structures being in electrical contact with the first metal layer; and
    attaching the bonding structures to bonding pads of the one or more dies to form bonding joints.

11. The method of claim 6, wherein the one or more alignment structures have a maximum dimension, the maximum dimension being less than about 40 µm.

12. The method of claim 6, wherein the one or more conductive features and the one or more alignment structures comprise a same material.

13. The method of claim 6, wherein the through via extends through the encapsulant and electrically couples the one or more conductive features of the first redistribution layer to the second redistribution layer.

14. The method of claim 6, wherein one or more alignment marks surround the one or more dies as viewed from top.

15. A method comprising:
    forming a first redistribution layer, wherein forming the first redistribution layer comprises forming a bond pad and an alignment structure, the bond pad and the alignment structure being formed of a same material using a same method;
    forming a through via over the first redistribution layer, the alignment structure being interposed between the through via and the bond pad;
    after forming the first redistribution layer and the through via, bonding a first side of a first die to the first redistribution layer;
    forming a molding compound over the first redistribution layer and surrounding the first die;
    forming a second redistribution layer; and
    after forming the second redistribution layer, bonding the second redistribution layer to a second side of the first die, the second side being opposite the first side, the second redistribution layer being electrically coupled to the first die using bonding joints, wherein first portions of the bonding joints belong to the first die and second portions of the bonding joints belong to the second redistribution layer before bonding the second redistribution layer to the second side of the first die.

16. The method of claim 15, wherein the through via extends through the molding compound and electrically couples the first redistribution layer to the second redistribution layer.

17. The method of claim 15, wherein the bond pad is electrically decoupled from the alignment structure.

18. The method of claim 15, wherein the bonding joints comprise micro bumps.

19. The method of claim 15, wherein the bonding joints comprise solder balls.

20. The method of claim 15, wherein at least a portion of the molding compound physically contacts a top surface of the alignment structure.

* * * * *